United States Patent
Ono et al.

(10) Patent No.: US 9,780,008 B2
(45) Date of Patent: Oct. 3, 2017

(54) SEMICONDUCTOR DEVICE, METHOD FOR MANUFACTURING THE SAME, AND RINSING LIQUID

(71) Applicant: MITSUI CHEMICALS, INC., Minato-ku (JP)

(72) Inventors: Shoko Ono, Ichihara (JP); Yasuhisa Kayaba, Sodegaura (JP); Hirofumi Tanaka, Sodegaura (JP); Kazuo Kohmura, Iwakuni (JP); Tsuneji Suzuki, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 119 days.

(21) Appl. No.: 14/413,554

(22) PCT Filed: Jul. 12, 2013

(86) PCT No.: PCT/JP2013/069225
§ 371 (c)(1),
(2) Date: Jan. 8, 2015

(87) PCT Pub. No.: WO2014/013956
PCT Pub. Date: Jan. 23, 2014

(65) Prior Publication Data
US 2015/0187670 A1    Jul. 2, 2015

(30) Foreign Application Priority Data

Jul. 17, 2012  (JP) ................................. 2012-158979
Feb. 28, 2013  (JP) ................................. 2013-039944

(51) Int. Cl.
*H01L 23/29* (2006.01)
*H01L 21/02* (2006.01)
(Continued)

(52) U.S. Cl.
CPC ........ *H01L 23/293* (2013.01); *C08G 73/0206* (2013.01); *C09D 179/02* (2013.01);
(Continued)

(58) Field of Classification Search
CPC . H01L 23/293; H08G 73/0206; C09D 179/02
See application file for complete search history.

(56) References Cited

U.S. PATENT DOCUMENTS

2003/0116854 A1    6/2003  Ito et al.
2004/0115910 A1*   6/2004  Passemard ........ H01L 21/76831
                                                             438/586
(Continued)

FOREIGN PATENT DOCUMENTS

EP    0897975 A1    2/1999
EP    1024965       8/2000
(Continued)

OTHER PUBLICATIONS

Office Action (Invitation to Respond to Written Opinion) issued by the Singapore Patent Office in corresponding Singapore Patent Application No. 11201500194U on Nov. 30, 2015 (7 pages).
(Continued)

*Primary Examiner* — Kimberly Rizkallah
*Assistant Examiner* — Maria Ligai
(74) *Attorney, Agent, or Firm* — Buchanan, Ingersoll & Rooney PC

(57) ABSTRACT

A method for manufacturing a semiconductor device including: a process of applying a sealing composition for a semiconductor to a semiconductor substrate, to form a sealing layer for a semiconductor on at least the bottom face and the side face of a recess portion of an interlayer insulating layer, the sealing composition including a polymer having a cationic functional group and a weight average molecular weight of from 2,000 to 1,000,000, each of the
(Continued)

content of sodium and the content of potassium in the sealing composition being 10 ppb by mass or less on an elemental basis; and a process of subjecting a surface of the semiconductor substrate at a side at which the sealing layer has been formed to heat treatment of from 200° C. to 425° C., to remove at least a part of the sealing layer.

7 Claims, 2 Drawing Sheets

(51) Int. Cl.

| | |
|---|---|
| H01L 21/3105 | (2006.01) |
| H01L 21/768 | (2006.01) |
| H01L 21/311 | (2006.01) |
| C09K 13/00 | (2006.01) |
| H01L 21/56 | (2006.01) |
| H01L 23/31 | (2006.01) |
| H01L 23/532 | (2006.01) |
| C09D 179/02 | (2006.01) |
| C08G 73/02 | (2006.01) |

(52) U.S. Cl.
CPC ........ *C09K 13/00* (2013.01); *H01L 21/02063* (2013.01); *H01L 21/02093* (2013.01); *H01L 21/02118* (2013.01); *H01L 21/02164* (2013.01); *H01L 21/02203* (2013.01); *H01L 21/02282* (2013.01); *H01L 21/02334* (2013.01); *H01L 21/02343* (2013.01); *H01L 21/02362* (2013.01); *H01L 21/3105* (2013.01); *H01L 21/31058* (2013.01); *H01L 21/31133* (2013.01); *H01L 21/56* (2013.01); *H01L 21/76831* (2013.01); *H01L 23/3185* (2013.01); *H01L 23/53228* (2013.01); *H01L 2924/0002* (2013.01)

(56) References Cited

U.S. PATENT DOCUMENTS

| | | |
|---|---|---|
| 2004/0266185 A1 | 12/2004 | Doke et al. |
| 2005/0148202 A1 | 7/2005 | Heiliger et al. |
| 2006/0046044 A1 | 3/2006 | Lee et al. |
| 2006/0255315 A1 | 11/2006 | Yellowaga et al. |
| 2007/0117371 A1 | 5/2007 | Engbrecht et al. |
| 2009/0215658 A1 | 8/2009 | Minsek et al. |
| 2011/0241210 A1* | 10/2011 | Ono ................ H01L 21/02362 257/751 |
| 2013/0171826 A1 | 7/2013 | Ono et al. |

FOREIGN PATENT DOCUMENTS

| | | |
|---|---|---|
| JP | 2007-161784 A | 8/2007 |
| JP | 2011-103490 A | 5/2011 |
| JP | 4699565 B2 | 5/2011 |
| JP | 4913269 B1 | 4/2012 |
| WO | WO 2009/153834 A1 | 12/2009 |
| WO | WO 2010/137711 A1 | 12/2010 |

OTHER PUBLICATIONS

International Search Report (PCT/ISA/210) mailed on Oct. 22, 2013, by the Japanese Patent Office as the International Searching Authority for International Application No. PCT/JP2013/069225.
Written Opinion (PCT/ISA/237) mailed on Oct. 22, 2013, by the Japanese Patent Office as the International Searching Authority for International Application No. PCT/JP2013/069225.
Extended Search Report issued by the European Patent Office in corresponding European Patent Application No. 13819549.0 on May 18, 2016 (16 pages).
Examination Report issued by the Intellectual Property Office Ministry of Economic Affairs, R.O.C., in corresponding Taiwanese Patent Application No. 10620351630 on Mar. 30, 2017(6 pages including partial English translation).

* cited by examiner

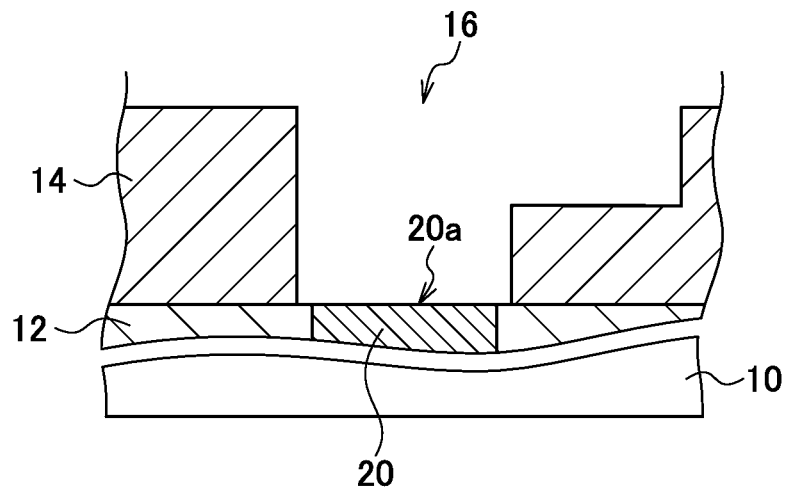
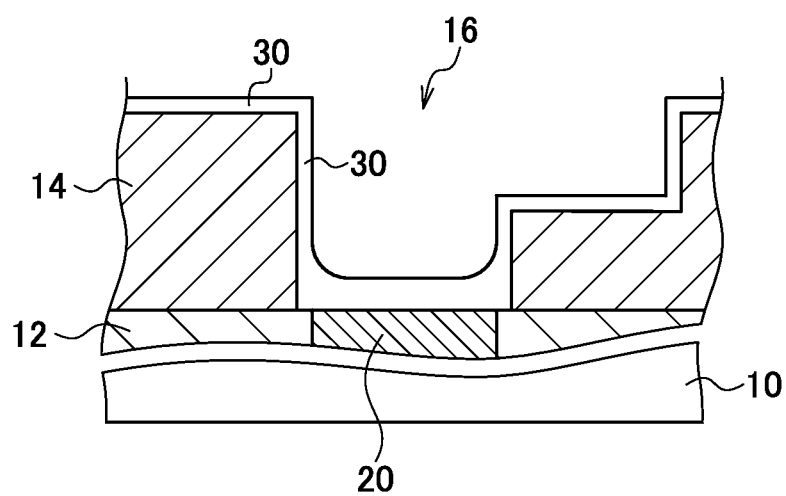

SEMICONDUCTOR DEVICE, METHOD FOR MANUFACTURING THE SAME, AND RINSING LIQUID

TECHNICAL FIELD

The present invention relates to a semiconductor device, a method for manufacturing the same, and a rinsing liquid.

BACKGROUND ART

In the field of semiconductor devices, in which scaling is proceeding, various investigations have been made on materials having a low dielectric constant (hereinafter also referred to as "low-k materials") and having a porous structure, as interlayer insulating layers for semiconductors.

In such porous interlayer insulating layers, increasing the porosity thereof with a view to further lowering the dielectric constant results in facilitation of entry of a metal component that is to be embedded as a wiring material such as copper, a plasma component (at least one of a radical or an ion; the same shall apply hereinafter) generated through a plasma treatment, or the like into minute openings of the semiconductor interlayer insulating layers, and thus results in an increase in the dielectric constant or occurrence of a current leakage in some cases.

Penetration of the metal component, the plasma component, or the like also occurs in non-porous interlayer insulating layers in some cases, which results in an increase in the dielectric constant or occurrence of a current leakage in some cases, similar to the case of porous interlayer insulating layers.

In order to deal with the above issue, a technique has been studied in which an interlayer insulating layer (in a case in which the interlayer insulating layer is a porous interlayer insulating layer, minute openings (pores) that are present in the porous interlayer insulating layer) is covered (sealed) using a polymer having a cationic functional group.

For example, a sealing composition for a semiconductor that contains a polymer having two or more cationic functional groups and a weight average molecular weight of from 2,000 to 100,000 is known as a sealing composition for a semiconductor that has an excellent pore-covering property (sealing property) with respect to porous interlayer insulating layers (see, for example, International Publication WO 2010/137711 pamphlet).

Furthermore, a semiconductor substrate is known which has a configuration having: an interlayer insulating layer having a recess portion (a trench or a via); and a wiring, at least a part of the surface of the wiring being exposed on at least a part of the bottom face of the trench or via. In the semiconductor substrate having the configuration described above, another wiring or the like is embedded in the trench or via in a subsequent step, whereby the wiring embedded in the trench or via and the wiring of which a part was exposed on the bottom face of the trench or via are electrically connected to each other (see, for example, International Publication WO 2009/153834 pamphlet).

DISCLOSURE OF INVENTION

Technical Problem

In the semiconductor substrate having an interlayer insulating layer which has a recess portion (such as a trench or a via) and a wiring which contains copper and of which at least a part of the surface thereof is exposed on at least a part of the bottom face of the recess portion, sealing the wall faces of the recess portion using a sealing layer for a semiconductor that includes a cationic functional group-containing polymer causes the following problems in some cases.

Specifically, the sealing layer for a semiconductor is formed not only on the side face but also on the bottom face, from among the wall faces (the side face and the bottom face) of the recess portion; namely, the sealing layer for a semiconductor is also formed on the wiring exposed on the bottom face. When another wiring is formed on the recess portion in a subsequent process with the sealing layer for a semiconductor left on the wiring, there are cases in which the sealing layer for a semiconductor is sandwiched between the wiring formed on the recess portion and the wiring of which a part is exposed on the bottom face of the recess portion, thereby blocking electric signals between these wirings (increasing the interconnection resistance between the wirings).

Meanwhile, with a view to addressing the above problem, an attempt may be made to remove the sealing layer for a semiconductor located on the bottom face of the recess portion (particularly, on the wiring exposed on the bottom face) using a rinsing liquid or the like before a wiring is formed on the recess portion; however, there are cases in which the attempt results in removal of the sealing layer for a semiconductor located on the side face of the recess portion as well as the sealing layer for a semiconductor located on the bottom face of the recess portion, thereby deteriorating the capacity to seal the side face of the recess portion. Forming a wiring on the recess portion under these conditions results in penetration of the material of the formed wiring (metal components) into the interlayer insulating layer in some cases, which leads to a decrease of the insulating properties of the interlayer insulating layer.

For the reasons discussed above, in the case of forming a sealing layer for a semiconductor on at least a side face of a recess portion of a semiconductor substrate that is provided with an interlayer insulating layer having the recess portion and a copper-containing wiring of which at least a part of the surface thereof is exposed on at least a part of the bottom face of the recess portion, a technique whereby provision of a sealing layer for a semiconductor on the wiring exposed on the bottom face of the recess portion can be avoided as far as possible is required.

Further, in semiconductor device manufacturing processes, there are cases in which the semiconductor device is cleaned with plasma in a state in which the sealing layer for a semiconductor is exposed, and there are also cases in which a layer is formed on the sealing layer for a semiconductor using a plasma CVD method or the like. Therefore, there are cases in which the sealing layer for a semiconductor is requested to have plasma resistance.

The inventions (the first invention to the fifth invention) have been made in view of the above problems, and aim to accomplish the following objects.

Specifically, an object of the first invention is to provide a method for manufacturing a semiconductor device whereby formation of a sealing layer for a semiconductor on a wiring that is exposed on the bottom face of a recess portion provided in an interlayer insulating layer is suppressed, but whereby a sealing layer for a semiconductor can be formed on at least a side face of the recess portion.

An object of the second invention is to provide a rinsing liquid with which a sealing layer for a semiconductor present on the exposed face of the wiring can effectively be removed.

An object of the third invention is to provide a rinsing liquid which can improve the plasma resistance of a sealing layer for a semiconductor.

An object of the fourth invention is to provide a semiconductor device in which diffusion of wiring materials (for example, copper) into an interlayer insulating layer is suppressed, and in which an increase in interconnection resistance of the connection portion between the wirings is suppressed.

Further, an object of the fifth invention is to provide a semiconductor device in which the plasma resistance of a sealing layer for a semiconductor is improved.

Solution to Problem

Specific means for solving the above problems include those described below.

<1> A method for manufacturing a semiconductor device, the method including:

a sealing composition application process of applying a sealing composition for a semiconductor to at least a bottom face and a side face of a recess portion of a semiconductor substrate, to form a sealing layer for a semiconductor on at least the bottom face and the side face of the recess portion, the sealing composition for a semiconductor including a polymer having a cationic functional group and a weight average molecular weight of from 2,000 to 1,000,000, each of the content of sodium and the content of potassium in the sealing composition for a semiconductor being 10 ppb by mass or less on an elemental basis, and the semiconductor substrate being provided with an interlayer insulating layer having the recess portion and a copper-containing wiring of which at least a part of the surface thereof is exposed on at least a part of the bottom face of the recess portion; and a removal process of subjecting a surface of the semiconductor substrate at a side at which the sealing layer for a semiconductor has been formed to heat treatment under a temperature condition of from 200° C. to 425° C., to remove at least a part of the sealing layer for a semiconductor that has been formed on an exposed face of the wiring.

In the present specification, the method for manufacturing a semiconductor device according to <1> above is also referred to as the "method for manufacturing a semiconductor device according to the first invention".

According to the method for manufacturing a semiconductor device according to the first invention, a sealing layer for a semiconductor can be formed on at least a side face of the recess portion although formation of a sealing layer for a semiconductor on a wiring exposed on the bottom face of the recess portion formed in the interlayer insulating layer is suppressed.

<2> The method for manufacturing a semiconductor device according to <1>, wherein the polymer has a cationic functional group equivalent weight of from 27 to 430.

<3> The method for manufacturing a semiconductor device according to <1> or <2>, wherein the polymer is polyethyleneimine or a polyethyleneimine derivative.

<4> The method for manufacturing a semiconductor device according to any one of <1> to <3>, the method including a washing process of washing at least the side face and the bottom face of the recess portion with a rinsing liquid having a temperature of from 15° C. to 100° C., after the sealing composition application process but before the removal process.

<5> The method for manufacturing a semiconductor device according to <4>, wherein the temperature of the rinsing liquid is from 30° C. to 100° C.

<6> The method for manufacturing a semiconductor device according to any one of <1> to <5>, the method including a washing process of washing at least the side face and the bottom face of the recess portion with a rinsing liquid having a pH at 25° C. of 6 or lower, after the sealing composition application process but before the removal process.

<7> The method for manufacturing a semiconductor device according to <6>, wherein the rinsing liquid includes a compound having, in one molecule thereof, at least one of a moiety A that blocks an active species or a moiety B that forms a bond with the polymer when heated.

<8> A rinsing liquid for use in removal of at least a part of the sealing layer for a semiconductor that is formed in the sealing composition application process in the method for manufacturing a semiconductor device according to any one of <1> to <7>, the rinsing liquid having a pH at 25° C. of 6 or lower.

In the present specification, the rinsing liquid according to <8> above is also referred to as the "rinsing liquid according to the second invention".

According to the rinsing liquid according to the second invention, the sealing layer for a semiconductor located on the exposed face of a wiring can effectively be removed.

The rinsing liquid according to the second invention is a rinsing liquid that is used to remove at least a part of the sealing layer for a semiconductor mentioned in the first invention.

<9> A rinsing liquid for a sealing layer for a semiconductor, the sealing layer being formed on a surface of an interlayer insulating layer of a semiconductor substrate that is provided with the interlayer insulating layer, and being derived from a polymer having a cationic functional group and a weight average molecular weight of from 2,000 to 1,000,000, the rinsing liquid including a compound having, in one molecule thereof, at least one of a moiety A that blocks an active species or a moiety B that forms a bond with the polymer when heated.

In the present specification, the rinsing liquid according to <9> above is also referred to as the "rinsing liquid according to the third invention".

According to the rinsing liquid according to the third invention, the plasma resistance of the sealing layer for a semiconductor can be improved.

<10> The rinsing liquid according to <9>, wherein the compound has, in one molecule thereof, two or more carboxyl groups as the moiety B, and wherein the compound has, in one molecule thereof, at least one of a structure in which each of two neighboring carbon atoms bonds to a carboxyl group or a structure in which each of two non-central carbon atoms from among three consecutive carbon atoms bonds to a carboxyl group.

<11> The rinsing liquid according to <9>, wherein the compound has the moiety A and the moiety B, the moiety A is at least one selected from the group consisting of an aromatic ring structure, an alicyclic structure, a manganese atom, and a silicon atom, and the moiety B is a carboxyl group.

<12> A semiconductor device including, on a semiconductor substrate:

an interlayer insulating layer having a recess portion;

a first wiring that includes copper, and that is formed on the recess portion;

a sealing layer for a semiconductor that is present at least between a side face of the recess portion of the interlayer insulating layer and the first wiring, and that includes a polymer having a cationic functional group and a weight average molecular weight of from 2,000 to 1,000,000; and a second wiring that contains copper, that has an upper face constituting at least a part of a bottom face of the recess portion, and that is electrically connected to the first wiring via the upper face, wherein the thickness of the sealing layer for a semiconductor in a connection portion between the first wiring and the second wiring is 5 nm or less.

In the present specification, the semiconductor device according to <12> above is also referred to as the "semiconductor device according to the fourth invention".

According to the semiconductor device according to the fourth invention, diffusion of a wiring material (for example, copper) into the interlayer insulating layer is suppressed, and an increase in the interconnection resistance of the connection portion between the wirings is suppressed.

The semiconductor device according to the fourth invention cannot be manufactured by known methods for manufacturing semiconductor devices. The semiconductor device according to the fourth invention is manufactured, for the first time, by the method for manufacturing a semiconductor device according to the first invention.

<13> A semiconductor device including, on a semiconductor substrate:

an interlayer insulating layer;

a first wiring that includes copper; and a sealing layer for a semiconductor that is present between the interlayer insulating layer and the first wiring, and that includes a polymer having a cationic functional group and a weight average molecular weight of from 2,000 to 1,000,000, wherein the sealing layer for a semiconductor includes at least one selected from the group consisting of an imide bond and an amide bond, and also includes at least one selected from the group consisting of an aromatic ring structure, a manganese atom, and a silicon atom.

In the present specification, the semiconductor device according to <13> above is also referred to as the "semiconductor device according to the fifth invention".

According to the semiconductor device according to the fifth invention, the plasma resistance of the sealing layer for a semiconductor is improved.

The semiconductor device according to the fifth invention cannot be produced by known methods for manufacturing semiconductor devices. The semiconductor device according to the fifth invention is produced, for the first time, using the rinsing liquid according to the third invention.

<14> The semiconductor device according to <12> or <13>, wherein the polymer has a cationic functional group equivalent weight of from 27 to 430.

<15> The semiconductor device according to any one of <12> to <14>, wherein the polymer is polyethyleneimine or a polyethyleneimine derivative.

<16> The semiconductor device according to any one of <12> to <15>, wherein the interlayer insulating layer is a porous interlayer insulating layer having an average pore radius of from 0.5 nm to 3.0 nm.

Advantageous Effects of Invention

According to the first invention, a method for manufacturing a semiconductor device whereby a sealing layer for a semiconductor can be formed on at least the side face of the recess portion although formation of the sealing layer for a semiconductor on a wiring exposed on the bottom face of a recess portion formed in an interlayer insulating layer is suppressed can be provided.

According to the second invention, a rinsing liquid with which the sealing layer for a semiconductor located on the exposed face of the wiring can effectively be removed can be provided.

According to the third invention, a rinsing liquid which can improve the plasma resistance of the sealing layer for a semiconductor can be provided.

According to the fourth invention, a semiconductor device can be provided in which diffusion of a wiring material (for example, copper) into the interlayer insulating layer is suppressed and an increase in the interconnection resistance of the connection portion between the wirings is suppressed.

According to the fifth invention, a semiconductor device can be provided in which the plasma resistance of the sealing layer for a semiconductor is improved.

BRIEF DESCRIPTION OF DRAWINGS

FIG. 1 is a schematic cross-sectional diagram schematically illustrating a cross section of a semiconductor substrate before the sealing composition application process, in one example of the method for manufacturing a semiconductor device according to the first invention.

FIG. 2 is a schematic cross-sectional diagram schematically illustrating a cross section of a semiconductor substrate after the sealing composition application process, in one example of the method for manufacturing a semiconductor device according to the first invention.

MODES FOR CARRYING OUT THE INVENTION

Figure 3:
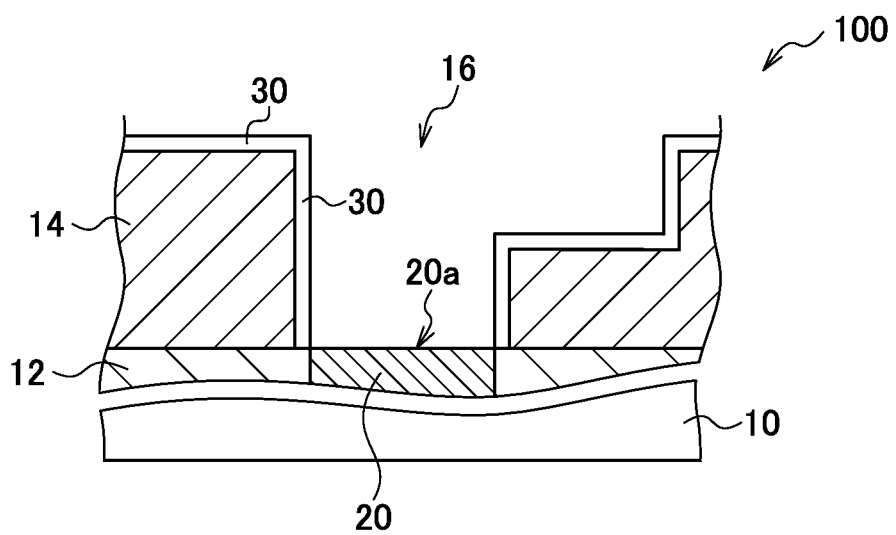
FIG. 3 is a schematic cross-sectional diagram schematically illustrating a cross section of a semiconductor substrate after the removal process, in one example of the method for manufacturing a semiconductor device according to the first invention.

Hereinafter, the inventions (the first invention to the fifth invention) are described in detail.

<<Method for Manufacturing Semiconductor Device According to the First Invention>>

The method for manufacturing a semiconductor device according to the first invention (hereinafter also referred to as the "manufacturing method according to the first invention") includes:

a sealing composition application process of applying a sealing composition for a semiconductor to at least a bottom face and a side face of a recess portion of a semiconductor substrate, to form a sealing layer for a semiconductor on at least the bottom face and the side face of the recess portion, the sealing composition for a semiconductor including a polymer having a cationic functional group and a weight average molecular weight of from 2,000 to 1,000,000, each of the content of sodium and the content of potassium in the sealing composition for a semiconductor being 10 ppb by mass or less on an elemental basis, and the semiconductor substrate provided with an interlayer insulating layer having the recess portion and a copper-containing wiring of which at least a part of the surface thereof is exposed on at least a part of the bottom face of the recess portion; and a removal process of subjecting a surface of the semiconductor substrate at a side at which the sealing layer for a semiconductor has been formed to heat treatment under a temperature condition of from 200° C. to 425° C., to remove at least a part of the sealing layer for a semiconductor that has been formed on an exposed face of the wiring.

The manufacturing method according to the first invention may further include other processes, if necessary.

According to the manufacturing method according to the first invention, a sealing layer for a semiconductor can be formed on the side face of the recess portion although formation of a sealing layer for a semiconductor on a wiring exposed on the bottom face of a recess portion formed in the interlayer insulating layer is suppressed.

The reason why such an effect can be obtained is presumed as follows; however, the first invention is not limited by the following reason.

Specifically, in the manufacturing method according to the first invention, through the sealing composition application process, cationic functional groups of the polymer having a cationic functional group and a weight average molecular weight of from 2,000 to 1,000,000 undergo multiple point adsorption on at least the bottom face and the side face of the recess portion of the interlayer insulating layer, whereby the side face and the bottom face of the recess portion (in a case in which the interlayer insulating layer is a porous interlayer insulating layer, minute openings (pores) present on the side face and the bottom face of the recess portion of the porous interlayer insulating layer) are covered by a sealing layer for a semiconductor (hereinafter also referred to as the "sealing layer" or the "polymer layer") that includes the polymer.

This sealing layer exhibits excellent sealing property with respect to the interlayer insulating layer. For example, in a case in which a wiring is formed on the recess portion in a subsequent process, diffusion of components (metal components or the like) of the wiring into the interlayer insulating layer is suppressed by the sealing layer formed on the side face of the recess portion. Further, the sealing layer formed of the polymer is a thin layer (for example, 5 nm or less); therefore, in a case in which a wiring is formed on the recess portion, the sealing layer provides excellent adhesion between the wiring formed on the recess portion and the interlayer insulating layer, and suppresses a change in relative dielectric constant.

Further, in the manufacturing method according to the first invention, the removal process results in preferential (preferably selective) removal of the sealing layer formed on the exposed face of the copper-containing wiring in the bottom face of the recess portion, as compared to the sealing layer formed at portions other than the exposed face (for example, the side face of the recess portion). The reason therefor is not clear, but it is surmised that the reason may be that a catalytic activity of copper contained in the wiring is exerted due to the heat treatment under the condition described above, and that the polymer contained in the sealing layer formed on the wiring is decomposed due to the catalytic activity.

Since the sealing layer sufficiently remains at portions other than the exposed face (for example, the side face of the recess portion) even after the removal process, the excellent sealing property with respect to the interlayer insulating layer is maintained by the residual sealing layer.

Next, an example of the manufacturing method according to the first invention is described with reference to the drawings; however, the first invention is by no means limited to the one example described below. In the figures (FIG. 1 to FIG. 4), illustration of elements (for example, an etching stopper layer or the like) not essential in the first invention is omitted. In the following, the same member is designated by the same reference character, and overlapping explanations thereof may be omitted.

FIG. 1 is a schematic cross-sectional diagram schematically illustrating a cross section of a semiconductor substrate before the sealing composition application process.

As illustrated in FIG. 1, a first interlayer insulating layer 14, a second interlayer insulating layer 12 that is disposed on the lower layer side of the first interlayer insulating layer 14 (the side nearer to the semiconductor substrate 10), and a wiring 20 that is embedded in the second interlayer insulating layer 12 are formed on a semiconductor substrate 10. The wiring 20 includes at least copper.

In the first interlayer insulating layer 14, a recess portion 16 is formed in advance through etching such as dry etching, and the wiring 20 is exposed at at least a part of the bottom face of the recess portion 16. Namely, at least a part of the bottom face of the recess portion 16 is constituted by an exposed face 20a of the wiring 20.

However, the semiconductor substrate before the sealing composition application process in the first invention is not limited to this example.

For example, a barrier layer or the like may be formed on at least a part of the side face of the recess portion 16.

Further, another layer, such as an etching stopper layer or the like, may be present between the first interlayer insulating layer 14 and the second interlayer insulating layer 12. Alternatively, the first interlayer insulating layer 14 and the second interlayer insulating layer 12 may be integrated to form one interlayer insulating layer.

The cross-sectional shape of the recess portion 16 illustrated in FIG. 1 is a cross-sectional shape having two different depths (in the stepped shape); however the cross-sectional shape of the recess portion in the first invention is not limited to this example. The cross-sectional shape of the recess portion may be a cross-sectional shape having only one depth (namely, having a constant depth), or a cross-sectional shape having three or more different depths. Further, in addition to the recess portion 16, another recess portion of which the depth of the deepest portion thereof is different from that of the recess portion 16 may also be provided in the interlayer insulating layer.

If necessary, a semiconductor circuit or the like, such as a transistor, may be formed between the semiconductor substrate 10, and the wiring 20 and the second interlayer insulating layer 12.

FIG. 2 is a schematic cross-sectional diagram schematically illustrating a cross section of a semiconductor substrate after the sealing composition application process.

As illustrated in FIG. 2, in the sealing composition application process, a sealing composition for a semiconductor is applied at a side of the semiconductor substrate 10 illustrated in FIG. 1 at which the first interlayer insulating layer 14 and the like are formed, to form a sealing layer 30 as a sealing layer for a semiconductor on at least the bottom face and the side face of the recess portion 16. In this process, the sealing layer 30 is also formed on the exposed face 20a of the wiring 20.

FIG. 3 is a schematic cross-sectional diagram schematically illustrating a cross section of a semiconductor substrate after the removal process.

In the removal process, a face of the semiconductor substrate after the sealing composition application process illustrated in FIG. 2 at a side at which the sealing layer 30 has been formed is subjected to heat treatment under the temperature condition of from 200° C. to 425° C., to remove the sealing layer for a semiconductor located on the exposed face 20a of the wiring 20. Here, it is not essential that the sealing layer for a semiconductor located on the exposed face 20a be entirely removed; it is sufficient that the sealing layer for a semiconductor located on the exposed face 20a be removed to such an extent that the interconnection resistance between the wiring (for example, the first wiring 40 in FIG. 4 described below) that will be embedded in the recess portion 16 in a subsequent process and the wiring 20 is not increased.

As described above, the removal process enables removal of at least a part of the sealing layer located on the wiring 20 while leaving the sealing layer 30 on at least the side face of the recess portion 16.

In this way, a semiconductor device 100 which has the sealing layer 30 on at least the side face of the recess portion 16, and in which the formation of the sealing layer for a semiconductor on the wiring 20 is suppressed, can be produced.

In the above description, an example of the manufacturing method according to the first invention is illustrated; however, the first invention is by no means limited to this example.

For example, as described below, it is preferable that a washing process of washing at least the side face and the bottom face of the recess portion 16 with a rinsing liquid is provided between the sealing composition application process and the removal process. The washing process further improves the removability of the sealing layer located on the wiring.

Further, the manufacturing method according to the first invention may include another process, such as a wiring formation process of embedding a wiring in the recess portion performed after the removal process.

Next, the respective processes of the manufacturing method according to the first invention are described in detail.

<Sealing Composition Application Process>

The sealing composition application process in the first invention is a process of applying a sealing composition for a semiconductor to at least the bottom face and the side face of a recess portion of a semiconductor substrate, the sealing composition for a semiconductor including a polymer having a cationic functional group and a weight average molecular weight of from 2,000 to 1,000,000, each of the content of sodium and the content of potassium in the sealing composition for a semiconductor being 10 ppb by mass or less on an elemental basis, the semiconductor substrate being provided with an interlayer insulating layer that has the recess portion and a wiring that includes copper, and at least a part of the surface of the wiring being exposed on at least a part of the bottom face of the recess portion; through the sealing composition application process, a sealing layer for a semiconductor is formed on at least the bottom face and the side face of the recess portion.

As the semiconductor substrate, ordinarily-employed semiconductor substrates may be used without limitations. Specifically, a silicon wafer, or a silicon wafer having a circuit, such as a transistor, formed thereon, may be used as the semiconductor substrate.

On the semiconductor substrate, at least an interlayer insulating layer that is provided with a recess portion and a wiring that includes copper and of which at least a part of the surface thereof is exposed on at least a part of the bottom face of the recess portion are provided.

It is preferable that at least a part of the interlayer insulating layer is a porous interlayer insulating layer.

With this configuration, the pores of the porous interlayer insulating layer can be covered by the sealing composition for a semiconductor, and, therefore, an increase in the dielectric constant or occurrence of current leakage, which may be caused by penetration of metal components (copper or the like) into the pores, can further be suppressed.

Further, it is preferable that the porous interlayer insulating layer includes porous silica and has silanol residues derived from the porous silica on the surface thereof (preferably, the face to which the sealing composition for a semiconductor is to be applied, for example, the side face of the recess portion). By the interaction between this silanol residue and the cationic functional group contained in the polymer, the pore-covering property of the polymer is further enhanced.

The pore radius in the porous interlayer insulating layer is not particularly limited. From the viewpoint of more effectively exerting the effect in terms of sealing property due to the sealing layer for a semiconductor, the pore radius is preferably from 0.5 nm to 3.0 nm, and more preferably from 1.0 nm to 2.0 nm.

As the porous silica, porous silicas ordinarily-employed in interlayer insulating layers of semiconductor devices may be used without particular limitations. Examples thereof include an oxide having uniform mesopores obtained by hydrothermal synthesis using silica gel, a surfactant, and the like in a sealed heat-resistant container through utilization of self-organization of an organic compound and an inorganic compound, as described in International Publication WO 91/11390 pamphlet, and porous silica manufactured from a condensate of an alkoxysilane and a surfactant, as described in *Nature,* 1996, vol. 379 (page 703) or *Supramolecular Science,* 1998, vol. 5 (page 247 and the like).

As the porous silica, it is also preferable to use porous silica (for example, porous silica formed using a composition that includes a specific siloxane compound) described in International Publication WO 2009/123104 pamphlet and International Publication WO 2010/137711 pamphlet.

The porous interlayer insulating layer can be formed, for example, by applying the composition for forming porous silica described above to a semiconductor substrate, and then carrying out heat treatment or the like in accordance with necessity.

The recess portion formed in the interlayer insulating layer is a recess portion (void) that is formed in the interlayer insulating layer by etching or the like. The recess portion is formed in order to embed, for example, a wiring material in a subsequent process. Specific examples of the recess portion include a trench and a via.

The width of the recess portion can be set to be, for example, from 10 nm to 32 nm.

The term "bottom face of the recess portion" refers to a face from among the wall faces of the recess portion that is positioned at the deepest portion of the recess portion (namely, a face of which the distance from the surface of the semiconductor substrate is the smallest), and that is substantially parallel to the surface of the semiconductor substrate. Further, the term "side face of the recess portion" refers to the other face(s) than the bottom face from among the wall faces of the recess portion.

As described below, the application of the sealing composition for a semiconductor to the bottom face and side face of the recess portion is useful since it enables effective suppression of diffusion of components constituting the wiring material into the pores of the porous interlayer insulating layer when a wiring material is embedded in the recess portion in a subsequent process.

The process of forming a recess portion in the interlayer insulating layer may be carried out in accordance with ordinarily-employed process conditions for manufacturing semiconductor devices. For example, a recess portion having a desired pattern can be formed by forming a hard mask and a photoresist on the interlayer insulating layer, and carrying out etching in accordance with the pattern of the photoresist. In a case in which the porous interlayer insulating layer includes porous silica as described above, the surface of the porous silica is abraded when the recess portion is formed, as a result of which the density of silanol groups on the surface tends to increase.

The semiconductor substrate is provided with a wiring that includes copper, and at least a part of the surface of this wiring is exposed on at least a part of the bottom face of the recess portion. Namely, at least a part of the bottom face of the recess portion is an exposed face of the copper-containing wiring. At the exposed face, the wiring having the exposed face and the wiring that is to be embedded in the recess portion in a subsequent process are electrically connected.

It is preferable that wirings that include copper in the first invention (including, for example, the first wiring and the second wiring described below) include copper as the main component.

Here, the "main component" refers to the component of which the content ratio (atom %) is the highest.

The content ratio is preferably 50 atom % or higher, preferably 80 atom % or higher, and preferably 90 atom % or higher.

The wiring may include another element (for example, Ta, Ti, Mn, Co, W, Ru, or N), if necessary.

The copper-containing wiring of which at least a part of the surface thereof is exposed on at least a part of the bottom face of the recess portion (for example, the second wiring described below) and the wiring that is to be embedded in the recess portion in a subsequent process (for example, the first wiring described below) can be formed in accordance with known process conditions. For example, a copper wiring may be formed directly on the silicon wafer or on the interlayer insulating layer on which a recess portion has been formed, using a metal CVD method, a sputtering method, or an electroplating method, and the film may be smoothed using chemical mechanical polishing (CMP). If necessary, on the surface of the film, a cap film may be formed, and, subsequently, a hard mask may be formed, and formation of an interlayer insulating layer and the wiring formation process may be repeated, to obtain a multilayer structure.

With regard to the configuration of the semiconductor substrate (semiconductor device) described above, the configuration of a semiconductor device described, for example, in International Publication WO 2009/153834 pamphlet (especially, paragraphs 0040 to 0041, and FIG. 2E) can be referenced.

(Sealing Composition for Semiconductor)

The sealing composition for a semiconductor includes a polymer having a cationic functional group and a weight average molecular weight of from 2,000 to 1,000,000, and each of the content of sodium and the content of potassium in the sealing composition for a semiconductor is 10 ppb by mass or less on an elemental basis.

The polymer has at least one type of cationic functional group. The polymer may further have an anionic functional group and/or a nonionic functional group, if necessary. Further, the polymer may be a polymer having a repetitive unit structure having a cationic functional group, or a polymer that does not have a specific repetitive unit structure but has a random structure formed by branched polymerization of a monomer constituting the polymer. In the first invention, the polymer is preferably a polymer that does not have a specific repetitive unit structure but has a random structure formed by branched polymerization of a monomer constituting the polymer, from the viewpoint of suppressing the diffusion of metal components.

The cationic functional group may be any functional group that can be positively charged, without particular limitations. Examples thereof include an amino group and a quaternary ammonium group. From the viewpoint of suppressing the diffusion of metal components, the cationic functional group is preferably at least one selected from the group consisting of a primary amino group and a secondary amino group.

The nonionic functional group may be a hydrogen bond-accepting group or a hydrogen bond-donating group. Examples thereof include a hydroxyl group, a carbonyl group, and an ether bond.

The anionic functional group may be any functional group that can be negatively charged, without particular limitations. Examples thereof include a carboxylic acid group, a sulfonic acid group, and a sulfuric acid group.

Since the polymer has a cationic functional group in one molecule thereof, the polymer is capable of suppressing the diffusion of metal components. Further, from the viewpoint of suppressing the diffusion of metal components, the polymer preferably has a high cation density. Specifically, the cationic functional group equivalent weight is preferably from 27 to 430, more preferably from 43 to 430, and particularly preferably from 200 to 400.

In a case in which the surface of the porous interlayer insulating layer is subjected to hydrophobication treatment using a known method, for example, the methods described in International Publication WO 04/026765 pamphlet, International Publication WO 06/025501 pamphlet, and the like, the density of polar groups at the surface is decreased; therefore, a cationic functional group equivalent weight of from 200 to 400 is also preferable.

Here, the term "cationic functional group equivalent weight" means a weight average molecular weight per cationic functional group, and is a value (Mw/n) obtained by dividing the weight average molecular weight (Mw) of the polymer by the number (n) of the cationic functional groups included in one molecule of the polymer. The greater the cationic functional group equivalent weight is, the smaller the density of cationic functional groups is. The smaller the cationic functional group equivalent weight is, the greater the density of cationic functional groups is.

In a case in which the polymer in the first invention has a repetitive unit structure having a cationic functional group (hereinafter also referred to as "specific unit structure"), in the specific unit structure, the cationic functional group may be included as at least a part of the main chain, or included as at least a part of a side chain, or included as at least a part of the main chain and at least a part of a side chain.

Further, in a case in which the specific unit structure includes two or more cationic functional groups, the two or more cationic functional groups may be the same as or different from each other.

The cationic functional group is preferably contained such that the ratio (hereinafter also referred to as the "relative distance between cationic functional groups) of the main chain length of a specific unit structure to the average distance between the adsorption points (for example, silanol residues) for cationic functional groups that are present on the surface of the porous interlayer insulating layer is from 0.08 to 1.2, and more preferably from 0.08 to 0.6. This embodiment enables the polymer to undergo multiple point adsorption on the surface of the porous interlayer insulating layer with higher efficiency.

In the first invention, the specific unit structure preferably has a molecular weight of from 30 to 500, and more preferably from 40 to 200, from the viewpoint of adsorbability to the interlayer insulating layer. Here, the molecular weight of the specific unit structure means the molecular weight of the monomer constituting the specific unit structure.

The specific unit structure in the first invention is preferably such that the relative distance between cationic functional groups is from 0.08 to 1.2 and the molecular weight of the specific unit structure is from 30 to 500, and more preferably such that the relative distance between cationic functional groups is from 0.08 to 0.6 and the molecular weight of the specific unit structure is from 40 to 200, from the viewpoint of adsorbability to the interlayer insulating layer.

In the first invention, specific examples of the specific unit structure that includes a cationic functional group include a unit structure derived from ethyleneimine, a unit structure derived from allylamine, a unit structure derived from diallyl dimethyl ammonium salt, a unit structure derived from vinylpyridine, a unit structure derived from lysine, a unit structure derived from methylvinylpyridine, and a unit structure derived from p-vinylpyridine. Among them, at least one of a unit structure derived from ethyleneimine or a unit structure derived from allylamine is preferable from the viewpoint of adsorbability to the interlayer insulating layer.

The polymer may further include at least one of a unit structure that includes a nonionic functional group or a unit structure that includes an anionic functional group.

Specific examples of the unit structure that includes a nonionic functional group include a unit structure derived from vinyl alcohol, a unit structure derived from alkylene oxide, and a unit structure derived from vinyl pyrrolidone.

Specific examples of the unit structure that includes an anionic functional group include a unit structure derived from styrenesulfonic acid, a unit structure derived from vinylsulfuric acid, a unit structure derived from acrylic acid, a unit structure derived from methacrylic acid, a unit structure derived from maleic acid, and a unit structure derived from fumaric acid.

In the first invention, in a case in which the polymer includes two or more kinds of specific unit structures, the specific unit structures may differ in any of the kind or number of polar group(s) contained therein, the molecular weight, or the like. Further, the two or more kinds of specific unit structures may be included in the form of a block copolymer or included in the form of a random copolymer.

The polymer may further include at least one kind of repetitive unit structure (hereinafter also referred to as "second unit structure") other than the specific unit structure described above. In a case in which the polymer includes the second unit structure, the specific unit structure and the second unit structure may be included in the form of a block copolymer or included in the form of a random copolymer.

The second unit structure may be any unit structure derived from a monomer that can polymerize with a monomer constituting the specific unit structure, without particular limitations. Examples of the second unit structure include a unit structure derived from olefin.

In a case in which the polymer in the first invention is a polymer that does not have a specific repetitive unit structure but has a random structure formed by branched polymerization of a monomer for constituting the polymer, the cationic functional group may be included as at least a part of the main chain, or included as at least a part of a side chain, or included as at least a part of the main chain and at least a part of the side chain.

Examples of monomers capable of forming the polymer include ethyleneimine and derivatives thereof.

Specific examples of the polymer that includes a cationic functional group in the first invention include polyethyleneimine (PEI), polyallylamine (PAA), polydiallyldimethylammonium (PDDA), polyvinylpyridine (PVP), polylysine, polymethylpyridylvinyl (PMPyV), protonated poly(p-pyridyl vinylene) (R-PHPyV), and derivatives thereof. Among them, polyethyleneimine (PEI) or a derivative thereof, polyallylamine (PAA), and the like are preferable, and the polymer is more preferably polyethyleneimine (PEI) or a derivative thereof.

In general, polyethyleneimine (PEI) can be manufactured by polymerizing ethyleneimine using ordinarily-employed methods. Polymerization catalysts, polymerization conditions, and the like may also be selected, as appropriate, from those generally employed in the polymerization of ethyleneimine. Specifically, for example, the reaction can be conducted in the presence of an effective amount of acid catalyst, such as hydrochloric acid, at a temperature of from 0° C. to 200° C. Further, ethyleneimine may be addition-polymerized to polyethyleneimine as the basis. The polyethyleneimine in the first invention may be a homopolymer of ethyleneimine, or a copolymer of ethyleneimine and a compound that can copolymerize with ethyleneimine, for example, an amine. With regard to such methods for manufacturing polyethyleneimine, for example, Japanese Patent Publication (JP-B) No. S43-8828 and JP-B No. S49-33120 may be referenced.

The polyethyleneimine in the first invention may be obtained using crude ethyleneimine obtained from monoethanol amine. Specifically, for example, JP-A No. 2001-2123958 or the like may be referenced.

The polyethyleneimine manufactured in the manner as described above has a complicated skeleton having a partial structure in which ethyleneimine is ring-opened to be bonded in the form of a straight chain, as well as a partial structure in which ethyleneimine is ring-opened to be bonded in the form of a branched chain, a partial structure in which straight chain partial structures are cross-linked to each other, and the like. Use of a polymer that has a cationic functional group and that has such a structure enables the polymer to undergo multiple point adsorption with higher efficiently. Further, a covering layer (a sealing layer) is formed more effectively due to the interaction between polymers.

It is also preferable that the polymer is a polyethyleneimine derivative. The polyethyleneimine derivative may be any compound that can be manufactured using the polyethyleneimine, without particular limitations. Specific examples of the polyethyleneimine derivative include a polyethyleneimine derivative obtained by introducing an alkyl group (preferably having from 1 to 10 carbon atoms) or an aryl group into polyethyleneimine, and a polyethyleneimine derivative obtained by introducing a crosslinking group, such as a hydroxyl group, into polyethyleneimine.

These polyethyleneimine derivatives can be manufactured using polyethyleneimine according to ordinarily-employed methods. Specifically, for example, these polyethyleneimine derivatives can be manufactured according to the method described in JP-A No. H6-016809 and the like.

The polyethyleneimine and derivatives thereof may be commercially available products. For example, products may be selected from polyethyleneimine and derivatives thereof available from NIPPON SHOKUBAI CO., LTD., BASF and the like, as appropriate, and used.

The weight average molecular weight of the polymer in the first invention is from 2,000 to 1,000,000, preferably from 2,000 to 600,000, more preferably from 2,000 to 300,000, still more preferably from 2,000 to 100,000, yet more preferably from 10,000 to 80,000, and particularly preferably from 20,000 to 60,000. When the weight average molecular weight of the polymer is from 2,000 to 1,000,000, an excellent covering property (sealing property) with respect to the recess portion of the interlayer insulating layer is obtained, and a decrease in dielectric constant during the formation of the polymer layer (the sealing layer) is suppressed.

For example, when the weight average molecular weight of the polymer is more than 1,000,000, the size of the polymer molecule would be greater than the size of the recess portion, and there are cases in which the polymer cannot enter the recess portion and the covering property with respect to the recess portion is lowered.

When the weight average molecular weight of the polymer is less than 2,000, there are cases in which the molecule of the polymer does not undergo multiple point adsorption on the interlayer insulating layer. In addition, the size of the polymer molecule would be smaller than the diameters of pores of the interlayer insulating layer, and there are cases in which the resin molecule enters the pores of the interlayer insulating layer and the dielectric constant of the interlayer insulating layer increases.

The weight average molecular weight and molecular weight distribution in the first invention refers to a polyethylene glycol-equivalent weight average molecular weight and a polyethylene glycol-equivalent molecular weight distribution as measured by GPC (Gel Permeation Chromatography) method.

Specifically, the weight average molecular weight and the molecular weight distribution in the first invention are measured using an aqueous solution having an acetic acid concentration of 0.5 mol/L and a sodium nitrate concentration of 0.1 mol/L as an eluent and using an analyzer SHODEX GPC-101 and a column ASAHIPAK GF-7M HQ, and are calculated using polyethylene glycol as a reference standard.

It is also preferable that the polymer has a critical micelle concentration in an aqueous solvent of 1% by mass or more, or is a polymer that does not substantially form a micelle structure. The expression "does not substantially form a micelle structure" as used herein means that a micelle is not formed under ordinary conditions, such as in an aqueous solvent at an ordinary temperature, namely, the critical micelle concentration cannot be measured. By using such a polymer, a thin polymer layer having a thickness at a molecular level (for example, 5 nm or less) can be formed, and an increase in the dielectric constant of the interlayer insulating layer can effectively be suppressed. In addition, adhesion between the interlayer insulating layer and the wiring material is enhanced more effectively.

Further, the polymer in the first invention is preferably a polyethyleneimine having a weight average molecular weight of from 2,000 to 600,000 and a cationic functional group equivalent weight of from 43 to 430, and more preferably a polyethyleneimine having a weight average molecular weight of from 10,000 to 80,000 and a cationic functional group equivalent weight of from 200 to 400. With this configuration, diffusion of metal components into the interlayer insulating layer is suppressed more effectively, and the tightness of adhesion between the interlayer insulating layer and the wiring material is further enhanced.

The content of the polymer in the sealing composition for a semiconductor is not particularly limited. The content of the polymer may be set to be, for example, from 0.01% by mass to 1.0% by mass, and is preferably from 0.02% by mass to 0.3% by mass. Further, the content of the polymer in the composition may be adjusted also in view of the area and pore density of the surface on which the polymer layer is to be formed using the sealing composition for a semiconductor.

In the sealing composition for a semiconductor, each of the content of sodium and the content of potassium is 10 ppb by mass or less on an elemental basis. The content, 10 ppb by mass or less, indicates that sodium and potassium are not positively contained. When the content of sodium or the content of potassium exceeds 10 ppb by mass on an elemental basis, a current leakage is generated in some cases.

The sealing composition for a semiconductor may include a solvent in addition to the polymer, if necessary. The sealing composition for a semiconductor includes a solvent at least in the sealing composition application process. The solvent may be any solvent in which the polymer uniformly dissolves and does not easily form a micelle, without particular limitations. Examples thereof include water (preferably, ultrapure water) and water-soluble organic solvents (for example, alcohols). In the first invention, it is preferable to use water or a mixture of water and a water-soluble organic solvent, as the solvent, from the viewpoint of micelle forming properties.

The boiling point of the solvent is not particularly limited. The boiling point of the solvent is preferably 210° C. or lower, and more preferably 160° C. or lower. With a boiling point of the solvent within the above range, for example, performing a washing process or a drying process after the sealing composition application process enables removal of the solvent and formation of the sealing layer for a semiconductor at a low temperature that does not significantly impair the insulating properties of the interlayer insulating layer and that does not cause separation of the sealing composition from the interlayer insulating layer. The term "sealing composition for a semiconductor" is also used for a sealing composition that has formed such a sealing layer for a semiconductor.

Further, the sealing composition for a semiconductor may further include a cation such as a cesium ion, if necessary, as long as the effects of the first invention are not impaired. When the sealing composition includes a cation of cesium or the like, it becomes easier for the resin in the sealing composition for a semiconductor to more uniformly spread over the surface of the interlayer insulating layer.

Moreover, it is preferable that a compound that erodes or dissolves the interlayer insulating layer is not added to the sealing composition for a semiconductor. Specifically, for example, there are cases in which inclusion of a fluorine compound or the like in the composition according to the first invention causes dissolution of the interlayer insulating layer and impairment of the insulating properties thereof, thereby increasing the relative dielectric constant, especially in a case in which the main material of the interlayer insulating layer is an inorganic compound such as silica.

It is preferable that the sealing composition for a semiconductor includes only a compound having a boiling point of 210° C. or lower, preferably 160° C. or lower, or a compound that does not exhibit degradability even under heat treatment up to 250° C.

The expression "compound that does not exhibit degradability even under heat treatment up to 250° C." refers to a compound of which a change in mass after the compound has been maintained at 250° C. under nitrogen for one hour relative to the mass thereof measured at 25° C. is smaller than 50%.

The pH of the sealing composition for a semiconductor is not particularly limited. The pH is preferably equal to or higher than the isoelectric point of the interlayer insulating layer, from the viewpoint of the adsorbability of the polymer to the interlayer insulating layer. Further, in a case in which the polymer has a cationic functional group as a polar group, the pH of the sealing composition for a semiconductor is preferably within a pH range in which the cationic functional group is in the cationic state. When the sealing composition for a semiconductor has a pH as specified above, the polymer more efficiently adsorbs on the surface of the interlayer insulating layer due to an electrostatic interaction between the interlayer insulating layer and the polymer.

The isoelectric point of the interlayer insulating layer is the isoelectric point exhibited by the compound constituting the interlayer insulating layer. For example, in a case in which the compound constituting the interlayer insulating layer is porous silica, the isoelectric point is around pH 2 (at 25° C.).

The expression "pH range in which the cationic functional group is in the cationic state" refers to a pH of the sealing composition for a semiconductor that is equal to or lower than the pKb of the resin that includes a cationic functional group. For example, in a case in which the resin that includes a cationic functional group is polyallylamine, the pKb is from 8 to 9, and in a case in which the resin that includes a cationic functional group is polyethyleneimine, the pKb is from 7 to 11.

Namely, in the first invention, the pH of the sealing composition for a semiconductor may be selected, as appropriate, in accordance with the kind of the compound constituting the interlayer insulating layer and the kind of the resin. For example, the pH is preferably from 2 to 11, and more preferably from 7 to 11. Here, the pH (at 25° C.) is measured using an ordinarily-employed pH measuring instrument.

As the sealing composition for a semiconductor, it is also preferable to use a sealing composition for a semiconductor described in, for example, International Publication WO 2010/137711 pamphlet or International Publication WO 2012/033172 pamphlet.

(Method of Applying Sealing Composition for Semiconductor)

In the sealing composition application process, the method employed for applying the sealing composition for a semiconductor is not particularly limited, and ordinarily-employed methods may be used.

For example, a method of contacting the sealing composition for a semiconductor with at least the bottom face and the side face of the recess portion of the interlayer insulating layer may be used which employs a dipping method (see, for example, U.S. Pat. No. 5,208,111), a spraying method (see, for example, Schlenoff et al., Langmuir, 16(26), 9968, 2000 or Izuquierdo et al., Langmuir, 21(16), 7558, 2005), a spin coating method (see, for example, Lee et al., Langmuir, 19(18), 7592, 2003 or J. Polymer Science, part B, polymer physics, 42, 3654, 2004), or the like.

The method employed for applying the sealing composition for a semiconductor using a spin coating method is not particularly limited. For example, a method may be employed which includes: dropping the sealing composition for a semiconductor onto an interlayer insulating layer while a substrate having the interlayer insulating layer formed thereon is rotated using a spin coater; then dropping a rinsing liquid such as water and performing rinsing treatment; and then increasing the rotation speed of the substrate to perform drying. In this process, the drying may be carried out after the dropping of the sealing composition for a semiconductor and the dropping of water are repeated plural times. Alternatively, a method may be used which includes, after dropping the sealing composition for a semiconductor; increasing the rotation speed of the substrate to perform drying; placing the substrate in heat treatment instrument, such as a hot plate, to perform heat treatment after the drying; and re-placing the substrate in the spin coater after the heat treatment, and performing rinsing treatment and drying. These procedures may be repeated plural times.

In the above method of applying the sealing composition for a semiconductor using a spin coating method, there is no limitations on various conditions such as the rotation speed of the substrate, the amount of the sealing composition for a semiconductor to be dropped, the duration of the dropping of the sealing composition for a semiconductor, the rotation speed of the substrate at drying, the amount of the rinsing liquid to be dropped, and the duration of the dropping of the rinsing liquid; these conditions may be adjusted, as appropriate, in consideration of, for example, the thickness of the polymer layer (sealing layer) to be formed.

In the sealing composition application process, the sealing composition for a semiconductor is applied to at least the bottom face and the side face of the recess portion of the semiconductor substrate (and, further, drying is performed according to an ordinarily-employed method, as necessary, in accordance with the necessity), whereby a sealing layer is formed on at least the bottom face and the side face of the recess portion. After the application of the sealing composition for a semiconductor, the polymer may be polymerized via crosslinking.

The thickness of the sealing layer for a semiconductor is not particularly limited. The thickness is, for example, from 0.3 nm to 5 nm, and preferably from 0.5 nm to 2 nm.

In a case in which the interlayer insulating layer is a porous interlayer insulating layer, the scope of the sealing layer includes not only a configuration in which the sealing layer is a layer composed only of the polymer, but also a configuration of a layer (a so-called impregnated layer) having a configuration in which the pores of the porous interlayer insulating layer is impregnated with the polymer.

Further, the concentration of the polymer contained in the sealing composition for a semiconductor for use in the sealing composition application process is preferably lower than the critical micelle concentration of the polymer. The polymer concentration as specified above enables the polymer to be applied, in the form of a thin layer (for example, 5 nm or less, and preferably 2 nm or less), to the interlayer insulating layer, and an increase in the dielectric constant can be suppressed.

<Removal Process>

The removal process in the first invention is a process that is performed after the process of applying the sealing composition for a semiconductor described above, and that includes thermally treating a surface of the semiconductor substrate at a side at which the sealing layer for a semiconductor has been formed, under a temperature condition of from 200° C. to 425° C., thereby removing at least a part of the sealing layer for a semiconductor formed on the exposed face of the wiring.

In the present process, through the heat treatment under the condition described above, the sealing layer formed on the exposed face of the copper-containing wiring is removed in preference to the sealing layer formed on portions (for example, the side face of the recess portion) other than the exposed face, (preferably, selectively over the sealing layer formed on portions other than the exposed face).

Here, the temperature is the temperature of a face of the semiconductor substrate at a side at which the sealing layer for a semiconductor has been formed.

When the temperature is lower than 200° C., the effect with respect to the removal of the sealing layer formed on the exposed face of the wiring would be insufficient.

When the temperature is higher than 425° C., migration of copper would occur easily.

The temperature is preferably from 250° C. to 400° C., and more preferably from 300° C. to 400° C.

The pressure at which the heat treatment is carried out (the pressure of the atmosphere to which the sealing layer for a semiconductor is exposed during the heat treatment) is not particularly limited, and is preferably higher than 17 Pa but not higher than the atmospheric pressure in terms of absolute pressure.

When the absolute pressure is higher than 17 Pa, the removal speed when the sealing layer on the exposed face of the wiring is removed further increases.

When the absolute pressure is not higher than the atmospheric pressure, the removal speed when the sealing layer on the exposed face of the wiring is removed is easier to adjust.

The absolute pressure is more preferably 1,000 Pa or higher but not higher than the atmospheric pressure, still more preferably 5,000 Pa or higher but not higher than the atmospheric pressure, and particularly preferably 10,000 Pa or higher but not higher than the atmospheric pressure.

Heating (heat treatment) in the present process may be carried out according to ordinary methods using an oven or a hot plate. As the oven, for example, a SPX-1120 manufactured by APEX Co., Ltd., or a VF-1000LP manufactured by Koyo Thermo Systems Co., Ltd., may be used.

Further, the heating (heat treatment) in the present process may be carried out under atmospheric air; however, from the viewpoints of, for example, suppressing oxidation of copper, which is the wiring material, heating (heat treatment) is more preferably carried out under an inert gas (for example, nitrogen gas, argon gas, or helium gas) atmosphere, and is particularly preferably carried out under a nitrogen gas atmosphere.

The duration of the heating (heat treatment) is not particularly limited, and the duration is, for example, 1 hour or less, preferably 30 minutes or less, more preferably 10 minutes or less, and particularly preferably 5 minutes or less. The lower limit of the duration of the heating (heat treatment) is not particularly limited, and may be set to, for example, 0.1 minutes.

When the duration of the heating (heat treatment) is 1 hour or less, the sealing property of the sealing layer with respect to the interlayer insulating layer are maintained at a higher level.

<Washing Process>

The method for manufacturing a semiconductor device according to the first invention preferably includes a washing process of washing at least the side face and the bottom face of the recess portion with a rinsing liquid, after the sealing composition application process but before the removal process.

By including the washing process, the removability of the sealing layer located on the exposed face of the wiring is further improved.

The rinsing liquid is not particularly limited. From the viewpoint of improvement in washing efficiency, the rinsing liquid preferably includes a solvent having high polarity.

Since the sealing composition for a semiconductor (hereinafter also referred to as "sealing composition") includes a polymer having a cationic functional group and has high polarity, the sealing composition easily dissolves in a high-polarity solvent. Thus, use of a rinsing liquid that contains a high-polarity solvent further improves the removability of the sealing layer located on the exposed face of the wiring.

Specifically, the rinsing liquid preferably includes a polar solvent such as water, methanol, ethanol, propanol, butanol, or propylene glycol monomethyl ether acetate.

Such polar solvents do not significantly impair the interaction between the interlayer insulating layer and the sealing composition for a semiconductor. Therefore, washing using a rinsing liquid that includes such a polar solvent is unlikely to cause removal of the sealing layer located on the interlayer insulating layer (the sealing layer that functions effectively), and thus such washing is preferable.

The rinsing liquid may include only one kind of polar solvent, or may include two or more kinds of polar solvents.

The temperature of the rinsing liquid in the present process is preferably from 15° C. to 100° C., more preferably from 30° C. to 100° C., still more preferably from 40° C. to 100° C., and particularly preferably from 50° C. to 100° C.

When the temperature of the rinsing liquid is 15° C. or higher (more preferably 30° C. or higher), the removability of the sealing layer located on the exposed face of the wiring is further improved.

When the temperature of the rinsing liquid is 100° C. or lower, evaporation of the rinsing liquid can be further suppressed.

The washing in the present process may be carried out while ultrasonic waves are applied to the rinsing liquid.

From the viewpoint of suppressing oxidization of a wiring material that includes copper, the rinsing liquid preferably includes a reducing agent or a compound having a reductive activity. An example of the reducing agent or the compound having a reductive activity is formalin.

Further, the rinsing liquid preferably has a content of oxidative compounds (for example, hydrogen peroxide, nitric acid) of 10% by mass or lower, and it is more preferable that the rinsing liquid does not include any oxidative compound, from the viewpoints of preventing cleavage of carbon-carbon bonds or the like in the polymer of the sealing composition and suppressing the detachment of the sealing layer (the sealing layer that functions effectively) formed on the surface of the interlayer insulating layer.

The rinsing liquid preferably has an ionic strength of 0.003 or higher, and preferably 0.01 or higher.

An ionic strength of 0.003 or higher is preferable from the viewpoint that such an ionic strength facilitates dissolution of the sealing layer (the polymer) but does not significantly impair the interaction between the interlayer insulating layer and the sealing layer.

The upper limit of the ionic strength is not particularly limited, and may be an ionic strength corresponding to a concentration at which the ionic compound can dissolve.

The ionic strength is a value represented by the following equation.

$$\text{Ionic strength} = \tfrac{1}{2} \times \Sigma(c \times Z^2)$$

In the equation, c represents the molar concentration of the ionic compound contained in the rinsing liquid, and Z represents the ionic valence of the ionic compound contained in the rinsing liquid.)

In order to adjust the ionic strength, ionic compounds such as the acid described below or an organic base (such as ammonia, pyridine, or ethylamine) may be added, if necessary.

Further, a polymer (for example, polyethyleneimine) that traps copper ions after copper is detached may be added.

It is also preferable that the rinsing liquid is a rinsing liquid having a pH at 25° C. of 6 or lower (preferably, 5 or lower). Use of such a rinsing liquid further improves the removability of the sealing layer located on the exposed face of the wiring, and enables dissolution and removal of copper oxide formed on the exposed face of the wiring.

The lower limit of the pH of such a rinsing liquid is not particularly limited, and the pH value thereof is preferably 1 or higher, and more preferably 2 or higher.

A pH value of 1 or higher enables dissolution of the interlayer insulating layer to be more suppressed, and, therefore, enables the sealing layer formed on the surface of the interlayer insulating layer to be more favorably maintained.

From the viewpoint of more effective realization of both the removability of the sealing layer located on the exposed face of the wiring and the maintenance of the sealing layer provided on the surface of the interlayer insulating layer, the pH of the rinsing liquid is preferably from 1 to 6, more preferably from 2 to 5, and particularly preferably from 2 to 4.

The rinsing liquid (especially, the rinsing liquid having a pH at 25° C. of 6 or lower) preferably includes at least one acid.

The acid is not particularly limited. The acid is preferably an acid that has a low tendency to contaminate or destroy the interlayer insulating layer and a low tendency to remain on the semiconductor substrate is preferable.

Specific examples of the acid include monocarboxylic acids such as formic acid and acetic acid; dicarboxylic acids such as oxalic acid, malonic acid, succinic acid, glutaric acid, adipic acid, pimelic acid, maleic acid, fumaric acid, and phthalic acid; tricarboxylic acids such as trimellitic acid and tricarballylic acid; oxymonocarboxylic acids such as hydroxybutyric acid, lactic acid, and salicylic acid; oxydicarboxylic acids such as malic acid and tartaric acid; oxytricarboxylic acids such as citric acid; aminocarboxylic acids such as aspartic acid and glutamic acid; organic acids such as para-toluenesulfonic acid and methanesulfonic acid; and inorganic acids such as hydrochloric acid, nitric acid, and phosphoric acid.

Further, examples of the acid also include specific compounds that are acids, among the specific compounds described below.

In the process of manufacturing a semiconductor device, there are cases in which a semiconductor device is cleaned with a plasma in a state in which a sealing layer is exposed, or cases in which a layer is formed on a sealing layer using, for example, a plasma CVD method.

Therefore, there are cases in which the sealing layer is required to have resistance to plasma.

From the viewpoint of improving the plasma resistance of the sealing layer, the rinsing liquid preferably includes at least one compound (hereinafter also referred to as the "specific compound") having, in one molecule thereof, at least one (preferably both) selected from the group consisting of a moiety A that blocks active species (for example, plasma active species such as radicals, ions, and electrons) and a moiety B (preferably a functional group; the same shall apply hereinafter) that forms a bond, under heating, with the polymer having a cationic functional group and a weight average molecular weight of from 2,000 to 1,000,000 (the polymer used for forming the sealing layer for a semiconductor).

In the following, the rinsing liquid that includes the specific compound is sometimes referred to as the "rinsing liquid according to the third invention". The rinsing liquid according to the third invention is favorable as a rinsing liquid for improving the plasma resistance of the sealing layer.

The specific compound is preferably an acid.

In a case in which the rinsing liquid according to the third invention includes an acid that is the specific compound, the effect with respect to the improvement of the plasma resistance of the sealing layer as well as the effect with respect to the improvement of the removability when the sealing layer located on the exposed face of the wiring is removed can be expected to be exerted.

Further, the rinsing liquid according to the third invention may include both an acid and the specific compound that is not an acid.

Moreover, from the viewpoint of more effectively exerting the effect with respect to the improvement of the removability, the rinsing liquid according to the third invention preferably has a pH at 25° C. of 6 or lower.

The moiety A is not particularly limited. For example, a functional group having a conjugated system, an alicyclic structure, and a metal atom are preferable as the moiety A. Specific examples thereof include an aromatic ring structure, an alicyclic structure, a manganese atom, and a silicon atom.

Regarding the form of the specific compound, the specific compound preferably has, in one molecule thereof, at least one selected from the group consisting of a benzene ring, a biphenyl skeleton, a naphthalene skeleton, a benzophenone skeleton, a diphenyl ether skeleton, and a bicyclo skeleton, as the moiety A.

The bicyclo skeleton may be either a saturated bicyclo skeleton or an unsaturated bicyclo skeleton.

The specific compound having a manganese atom as the moiety A is, for example, manganese(II) diacetate.

Examples of the specific compound having a silicon atom as the moiety A include an alkoxysilane compound (for example, bis(triethoxysilyl)ethane or dimethyldiethoxysilane, or the like) and a disilyl compound (for example, hexamethyldisiloxane or the like). In regard to the alkoxysilane compound and disilyl compound, the alkoxysilane compounds and the disilyl compounds described in International Publication WO 2009/123104 pamphlet and International Publication WO 2010/137711 pamphlet may also be used.

The moiety B is, for example, a carboxyl group. For example, in a case in which the sealing layer includes a polymer (for example, polyethyleneimine) that includes at least one of a primary amino group or a secondary amino group (an imino group), the carboxyl group reacts with the at least one of a primary amino group or a secondary amino group (an imino group) contained in the polymer, to form an amide bond or an imide bond.

This further improves the plasma resistance of the sealing layer.

The number of moieties B in one molecule of the specific compound is preferably 1 or greater, more preferably 2 or greater, still more preferably 3 or greater, and particularly preferably 4 or greater.

The upper limit of this number is not particularly limited. This number may be set to be, for example, 6 or smaller.

Next, examples of the specific compound that are preferable from the viewpoint of improving the plasma resistance of the sealing layer are provided.

Specific examples of the specific compound that is an acid include the above-described monocarboxylic acids, dicarboxylic acids, tricarboxylic acids, oxymonocarboxylic acids, oxydicarboxylic acids, oxytricarboxylic acids, aminocarboxylic acids, and organic acids.

More preferable examples of the specific compound that is an acid are polyvalent carboxylic acids such as naphthalene tetracarboxylic acids (for example, naphthalene-2,3,6,7-tetracarboxylic acid, naphthalene-1,4,5,8-tetracarboxylic acid), biphenyl tetracarboxylic acids (for example, 3,3',4,4'-biphenyltetracarboxylic acid), benzophenone tetracarboxylic acids (for example, 3,3',4,4'-benzophenonetetracarboxylic acid), benzene hexacarboxylic acid, pyromellitic acid, trimellitic acid (namely, 1,2,4-benzenetricarboxylic acid), diphenyl ether tetracarboxylic acid (3,3',4,4'-diphenyl ether tetracarboxylic acid), phenylene diacetates (for example, meta-phenylene diacetate, ortho-phenylene diacetate), bicyclo[2.2.2]oct-7-ene-2,3,5,6-tetracarboxylic acid, ethylenediamine tetraacetic acid, citric acid, meso-butane-1,2,3,4-tetracarboxylic acid, and polyacrylic acid, and barbituric acid.

The weight average molecular weight of the polyacrylic acid is preferably from 1,000 to 800,000, more preferably from 1,000 to 600,000, still more preferably from 1,000 to 200,000, yet more preferably from 5,000 to 80,000, yet more preferably from 10,000 to 50,000, and particularly preferably from 20,000 to 30,000. The weight average molecular weight of polyacrylic acid is measured in the same manner as that in the measurement of the weight average molecular weight of the polymer contained in the sealing layer.

Examples of the specific compound that is not an acid include ortho-phthalic aldehyde, terephthalic aldehyde, manganese(II) diacetate, and benzotriazole.

Among the above compounds, the specific compounds that are acids are preferable. In particular, polyvalent carboxylic acids are more preferable, and naphthalene tetracarboxylic acid, biphenyl tetracarboxylic acid, benzophenone tetracarboxylic acid, benzene hexacarboxylic acid, and pyromellitic acid are particularly preferable.

It is also preferable that the specific compound is a compound which has, in one molecule thereof, two or more carboxyl groups as the moiety B, and has a structure in which each of two neighboring carbon atoms bonds to a carboxyl group or a structure in which each of two non-central carbon atoms from among three consecutive carbon atoms bonds to a carboxyl group.

With this configuration, an imide bond is more effectively formed through a reaction between a carboxyl group contained in the specific compound and at least one of a primary amino group or a secondary amino group (an imino group) contained in the polymer, particularly in a case in which the sealing layer includes a polymer (for example, polyethyleneimine) that includes at least one of a primary amino group or a secondary amino group (an imino group. As a result of the effective formation of the imide bond, the plasma resistance of the sealing layer is further improved.

The specific compound in this case may be a compound that has the moiety A, or a compound that does not have the moiety A.

Here, examples of the structure in which each of two neighboring carbon atoms bonds to a carboxyl group include the structure of citric acid, a structure in which a carboxyl group is bonded to the ortho position of a benzene ring, and a structure in which carboxyl groups are bonded to the positions 2 and 3 (or positions 6 and 7) of a naphthalene ring.

Examples of the structure in which each of two non-central carbon atoms from among three consecutive carbon atoms is bonded to a carboxyl group include a structure in which carboxyl groups are bonded to the positions 1 and 8 (or positions 4 and 5) of a naphthalene ring.

Among the specific compounds of these types, 3,3',4,4'-diphenyl ether tetracarboxylic acid, 3,3',4,4'-biphenyltetracarboxylic acid, 3,3',4,4'-benzophenonetetracarboxylic acid, naphthalene-2,3,6,7-tetracarboxylic acid, naphthalene-1,4,5,8-tetracarboxylic acid, benzene hexacarboxylic acid, pyromellitic acid, trimellitic acid, bicyclo[2.2.2]oct-7-ene-2,3,5,6-tetracarboxylic acid, meso-butane-1,2,3,4-tetracarboxylic acid, and citric acid are particularly preferable.

It is also preferable that the specific compound is a compound which has both the moiety A and the moiety B, and in which the moiety A is at least one selected from the group consisting of an aromatic ring structure, an alicyclic structure, a manganese atom, and a silicon atom, and in which the moiety B is a carboxyl group.

Among the specific compounds of this type, 3,3',4,4'-diphenyl ether tetracarboxylic acid, 3,3',4,4'-biphenyltetracarboxylic acid, 3,3',4,4'-benzophenonetetracarboxylic acid, naphthalene-2,3,6,7-tetracarboxylic acid, naphthalene-1,4,5,8-tetracarboxylic acid, benzene hexacarboxylic acid, pyromellitic acid, trimellitic acid, bicyclo[2.2.2]oct-7-ene-2,3,5,6-tetracarboxylic acid, and meta-phenylene diacetate are particularly preferable.

From the viewpoint of imparting plasma resistance to the sealing layer, the above-described rinsing liquid according to the third invention may also be used with respect to a sealing layer that is formed on a portion other than the recess portion, or a sealing layer formed on a semiconductor substrate on which a copper-containing wiring is not exposed.

Examples of the plasma include a plasma produced from hydrogen gas, helium gas, argon gas, nitrogen gas, ammonia gas, or the like. The conditions in which the plasma is generated is not particularly limited, and are preferably conditions in which the polymer layer (sealing layer) deposited on at least the side face of the recess portion, which greatly contributes to the sealing function, is not excessively removed. Examples of such conditions include conditions in which the total pressure is from 20 mTorr to 200 mTorr, the gas flow rate is from 20 sccm to 100 sccm, the cathode electrode diameter is from 5 cm to 15 cm, the discharge electric power is from 20 W to 200 W, and the treatment time (discharge time) is from 10 sec to 60 sec.

The amounts of the solvent, acid, reducing agent, ionic compound, specific compound, and the like that may be contained in the rinsing liquid (including the rinsing liquid according to the third invention; the same shall apply hereinafter) are not particularly limited; these amounts may be adjusted, as appropriate, such that, for example, the pH and the ionic strength of the rinsing liquid fall within their respective preferable ranges described above.

The rinsing liquid can be prepared by mixing, for example, the above-described solvent, acid, reducing agent, ionic compound, specific compound, and the like. In order to prevent contamination of the semiconductor circuit, it is preferable that the rinsing liquid is prepared under a clean environment such as in a clean room or the like, or that contaminants to the semiconductor circuit are removed by purification, filtration, or the like after the rinsing liquid is prepared.

When combined with the removal process described above, the present process is able to rapidly washing away (rinsing away) the surplus sealing layer formed on the wiring using the rinsing liquid, while allowing the effective sealing layer that seals the interlayer insulating layer to be retained. In addition, as described above, oxides of the wiring material can also be removed, whereby separation between the wiring material and the low dielectric constant material, or separation between the wiring materials, can be suppressed.

It is also preferable that the washing in the present process is carried out under a non-oxidizing atmosphere. Carrying out the washing under a non-oxidizing atmosphere makes it possible to prevent excessive removal of the copper wiring, which would otherwise occur due to repeated processes in which: copper oxide that was present on the wiring surface prior to rinsing is removed using the rinsing liquid; thereafter, copper on the wiring surface further oxidizes into copper oxide; and, again, this copper oxide is dissolved (removed) using the rinsing liquid. The non-oxidizing atmosphere may be achieved, for example, using a reducing atmosphere gas.

In the present process, the washing may be carried out using ordinarily-employed methods. The method employed therefor is not particularly limited.

The washing time is not particularly limited. The washing time may be set to be, for example, from 0.1 minutes to 60 minutes, and more preferably from 0.1 minutes to 10 minutes.

<Other Processes>

The method for manufacturing a semiconductor device according to the first invention may further include usually-performed processes as other processes, such as a wiring formation process and a barrier layer formation process.

The wiring formation process is, for example, a process of forming a wiring on the recess portion after the removal process described above.

The wiring formation process may be carried out employing known process conditions. For example, a copper wiring may be formed using a metal CVD method, a sputtering method, or an electroplating method, and the film may be smoothened using CMP. Subsequently, a cap film is formed on the surface of the film. Further, if necessary, a hard mask may be formed, and the processes described above may be repeated, to form a multilayer structure.

Further, the method for manufacturing a semiconductor device according to the first invention may further include a barrier layer (copper barrier layer) formation process that is performed before the wiring formation process. By forming a barrier layer, diffusion of metal components into the interlayer insulating layer can more effectively be suppressed.

The barrier layer formation process can be carried out employing ordinarily-employed process conditions. For example, after the removal process described above (in a case in which the washing process described above is included to be performed after the removal process, after the washing process), a barrier layer formed of a titanium compound (titanium nitride or the like), a tantalum compound (tantalum nitride or the like), a ruthenium compound, a manganese compound, a cobalt compound (CoW or the like), a tungsten compound, or the like can be formed using, for example, a vapor phase growth method (CVD).

Moreover, the method for manufacturing a semiconductor device according to the first invention may include a post-rinsing process of further washing off the rinsing liquid remaining on the semiconductor substrate, after the washing process (before or after the removal process). The post-rinsing process may be performed using ordinarily-employed methods, and is not particularly limited. Specifically, washing may be performed using a post-rinsing method as described in JP-A No. 2008-47831. Further, the rinsing liquid (hereinafter referred to as "post-rinsing liquid") for use in the post-rinsing process may be any liquid that can remove the rinsing liquid described above through dissolution or decomposition, without particular limitations. Specifically, an organic solvent having polarity such as an alcohol, water, a mixture of an organic solvent having polarity and water, or a solvent that includes ozone or an acid having degradability such as nitric acid or sulfuric acid, may be used.

Next, the use of the above-described rinsing liquid according to the third invention is further described.

The rinsing liquid according to the third invention is suitable as a rinsing liquid for improving the plasma resistance of the sealing layer for a semiconductor.

For example, in a case in which the method for manufacturing a semiconductor device according to the first invention includes the washing process described above, the rinsing liquid according to the third invention is suitable as the rinsing liquid for use in the washing process.

However, the rinsing liquid according to the third invention may generally be used for uses in which the plasma resistance of a sealing layer for a semiconductor formed on a surface of an interlayer insulating layer of a semiconductor device provided with the interlayer insulating layer is to be improved, in addition to the use in the method for manufacturing a semiconductor device according to the first invention.

For example, the rinsing liquid according to the third invention is also suitable as a rinsing liquid for improving the plasma resistance of a sealing layer for a semiconductor that is formed on a surface of an interlayer insulating layer of a semiconductor substrate provided with the interlayer insulating layer, and that is derived from a polymer having a cationic functional group and a weight average molecular weight of from 2,000 to 1,000,000. More specifically, the rinsing liquid according to the third invention is suitable as a rinsing liquid for use in the washing process of the following method of manufacturing a semiconductor device, which includes a plasma process.

Namely, the method of manufacturing a semiconductor device, which includes a plasma process, a manufacturing method that includes: a sealing composition application process of applying a sealing composition for a semiconductor which includes a polymer having a cationic functional group and a weight average molecular weight of from 2,000 to 1,000,000 and in which each of the content of sodium and the content of potassium is 10 ppb by mass or less on an elemental basis, to a surface of an interlayer insulating layer of a semiconductor substrate provided with the interlayer insulating layer (which may be provided with a recess portion), to form a sealing layer for a semiconductor on the surface of the interlayer insulating layer; a washing process of washing the formed sealing layer for a semiconductor with a rinsing liquid; and a plasma process of exposing, after the washing process, a face of the semiconductor substrate at a side at which the sealing layer for a semiconductor has been formed to a plasma.

In this manufacturing method, in a case in which the interlayer insulating layer is provided with a recess portion, the sealing layer for a semiconductor may be formed on at least one of the wall face of the recess portion of the interlayer insulating layer or the portion (flat portion) other than the recess portion of the interlayer insulating layer.

Here, in a case in which the sealing layer for a semiconductor is formed on the wall face of the recess portion of the interlayer insulating layer and the portion (flat portion) other than the recess portion, the procedures in the washing process and the procedures in the plasma process may be performed with respect to the sealing layer formed on the wall face of the recess portion, or on the sealing layer for a semiconductor formed on the portion (flat portion) other than the recess portion.

In this manufacturing method, the semiconductor substrate to which the sealing composition for a semiconductor is to be applied may be provided with, for example, a wiring that includes copper or a semiconductor circuit (transistor).

Examples of the plasma in the plasma process described above include a plasma produced from a hydrogen gas, a helium gas, a nitrogen gas, an ammonia gas, or the like. Specific examples of the mode of the plasma process include a plasma cleaning process of cleaning, with a plasma, the semiconductor substrate on which the sealing layer for a semiconductor has been formed, and a plasma CVD process of forming a layer on the semiconductor substrate on which the sealing layer for a semiconductor has been formed, using a plasma CVD method.

The conditions in which exposure to the plasma is performed is not particularly limited. Conditions in which the polymer layer (sealing layer) deposited on at least the side face of the recess portion and greatly contributing to the sealing function is not excessively removed are preferably adopted. Examples of such conditions include conditions in which the total pressure is from 20 mTorr to 200 mTorr, the gas flow rate is from 20 sccm to 100 sccm, the cathode electrode diameter is from 5 cm to 15 cm, the discharge electric power is from 20 W to 200 W, and the treatment time (discharge time) is from 10 sec to 60 sec.

In the method of manufacturing a semiconductor device that includes the plasma process described above, preferable ranges of the sealing composition application process and preferable ranges of the washing process are respectively the same as the preferable ranges of the sealing composition application process and the preferable ranges of the washing process in the method for manufacturing a semiconductor device according to the first invention.

The method of manufacturing a semiconductor device that includes the plasma process may include the removal process described above, between the sealing composition application process and the washing process.

A mode of the method of manufacturing a semiconductor device that includes a plasma process in which the removal process described above is provided between the washing process and the plasma process is included in the scope of the method for manufacturing a semiconductor device according to the first invention.

Preferable modes of the method of manufacturing a semiconductor device that includes a plasma process are the same as the preferable modes of the method for manufacturing a semiconductor device according to the first invention, except that the removal process described above is not provided between the washing process and the plasma process, and that the modes are not limited to a mode in which the interlayer insulating film is provided with a recess portion (for example, a mode in which a wiring that includes copper is exposed on the bottom face of the recess portion of the interlayer insulating layer).

A more specific example of the mode of the method of manufacturing a semiconductor device that includes a plasma process is a mode that includes:

a sealing composition application process of applying a sealing composition for a semiconductor to at least the bottom face and the side face of a recess portion of a semiconductor substrate, to form a sealing layer for a semiconductor on at least the bottom face and the side face of the recess portion, the sealing composition for a semiconductor including a polymer which has a cationic functional group and a weight average molecular weight of from 2,000 to 1,000,000 and in which each of the content of sodium and the content of potassium is 10 ppb by mass or less on an elemental basis, the semiconductor substrate including an interlayer insulating layer that is provided with the recess portion and a wiring that includes copper, and at least a part of the surface of the wiring being exposed on at least a part of the bottom face of the recess portion;

a washing process of washing the formed sealing layer for a semiconductor, using a rinsing liquid; and a plasma process of exposing, after the washing process, a face of the semiconductor substrate at a side at which the sealing layer for a semiconductor has been formed to a plasma.

<<Rinsing Liquid>>

<Rinsing Liquid According to the Second Invention>

The rinsing liquid according to the second invention is a rinsing liquid which is used to remove at least a part of the sealing layer for a semiconductor that has been formed in the sealing composition application process in the above-described method for manufacturing a semiconductor device according to the first invention, the rinsing liquid having a pH at 25° C. of 6 or lower.

With the rinsing liquid according to the second invention, the sealing layer for a semiconductor located on the exposed face of the wiring can effectively be removed.

The rinsing liquid according to the second invention is preferable for use as the rinsing liquid used in the washing process of washing at least the side face and the bottom face of the recess portion with the rinsing liquid after the sealing composition application process but before the removal process.

Particularly preferable embodiments of the rinsing liquid according to the second invention are the same as those described in the section for the washing process in the first invention described above.

A solvent of the rinsing liquid according to the second invention is preferably the polar solvent described above.

<Rinsing Liquid According to the Third Invention>

As described above, the rinsing liquid according to the third invention is a rinsing liquid that includes at least one kind of the specific compound.

With the rinsing liquid according to the third invention, the plasma resistance of the sealing layer for a semiconductor can be improved.

Setting the pH at 25° C. of the rinsing liquid according to the third invention to 6 or lower enables the sealing layer for a semiconductor on the exposed face of the wiring to be removed effectively, similar to the case of the rising liquid according to the second invention.

The rinsing liquid according to the third invention is preferably a rinsing liquid for a sealing layer for a semiconductor, the sealing layer being formed on the surface of an interlayer insulating layer of a semiconductor substrate provided with the interlayer insulating layer, and being derived from a polymer that has a cationic functional group and a weight average molecular weight of from 2,000 to 1,000,000.

More preferable ranges of the rinsing liquid according to the third invention are the same as those described in the section for the washing process in the first invention described above.

A solvent of the rinsing liquid according to the third invention is preferably the polar solvent described above.

<<Semiconductor Device>>
<Semiconductor Device According to the Fourth Invention>>

The semiconductor device according to the fourth invention includes, on a semiconductor substrate:
an interlayer insulating layer;
a first wiring that includes copper;
a sealing layer for a semiconductor that is present between the interlayer insulating layer and the first wiring, and that includes a polymer having a cationic functional group and a weight average molecular weight of from 2,000 to 1,000,000; and
a second wiring that includes copper and that is electrically connected to the first wiring,
in which the thickness of the sealing layer for a semiconductor in the connection portion between the first wiring and the second wiring is 5 nm or less.

A preferable embodiment of the semiconductor device according to the fourth invention is an embodiment that includes, on a semiconductor substrate:
an interlayer insulating layer having a recess portion;
a copper-containing first wiring that is formed on the recess portion;
a sealing layer for a semiconductor that is present at least between the side face of the recess portion of the interlayer insulating layer and the first wiring; and
a copper-containing second wiring of which the upper face constitutes at least a part of the bottom face of the recess portion, and which is electrically connected to the first wiring at the upper face,
in which the thickness of the sealing layer for a semiconductor in the connection portion between the first wiring and the second wiring is 5 nm or less.

In the fourth invention, the "first wiring" refers to a wiring that is disposed on the recess portion of the interlayer insulating layer. Further, the "second wiring" refers to a wiring that is disposed at the lower layer side (the side nearer to the semiconductor substrate) relative to the first wiring, and that is electrically connected to the first wiring at the upper face thereof.

In the semiconductor device according to the fourth invention, preferable ranges of the individual elements, such as the interlayer insulating layer and the polymer, are the same as the above-described preferable ranges of the respective elements described in the method for manufacturing a semiconductor device according to the first invention.

Next, an example of the semiconductor device according to the fourth invention is described with reference to a figure; however, the fourth invention is by no means limited to the following example.

Figure 4:
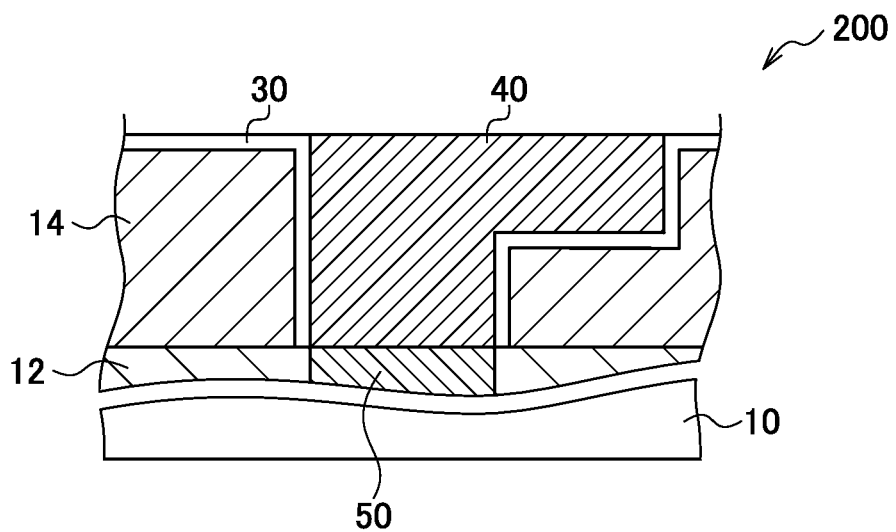
FIG. 4 is a schematic cross-sectional diagram schematically illustrating a cross section of a semiconductor device, in one example of the semiconductor device according to the fourth invention.

FIG. 4 is a schematic cross-sectional diagram schematically illustrating a cross section of a semiconductor device 200 according to one example of the semiconductor device according to the fourth invention.

As illustrated in FIG. 4, the semiconductor device 200 includes, on a semiconductor substrate 10, an interlayer insulating layer composed of a first interlayer insulating layer 14 provided with a recess portion and a second interlayer insulating layer 12 disposed at the lower layer side of the first interlayer insulating layer 14. The semiconductor device 200 further includes: a second wiring 50 that includes copper and that is embedded in the second interlayer insulating layer 12; and a first wiring 40 that includes copper and that is embedded in the recess portion. Moreover, the semiconductor device 200 includes a sealing layer 30 that is formed at least between the side face of the recess portion of the first interlayer insulating layer 14 and the first wiring 40.

The first wiring 40 and the second wiring 50 are electrically connected to each other, and the sealing layer 30 is not present in this connection portion.

This semiconductor device 200 is a semiconductor device having a configuration in which the first wiring 40 is embedded in the recess portion 16 of the semiconductor device 100 (FIG. 3) described above.

The configurations of the semiconductor substrate 10, the first interlayer insulating layer 14, the second interlayer insulating layer 12, the second wiring 50, and the sealing layer 30 in the semiconductor device 200 are the same as the configurations of the semiconductor substrate 10, the first interlayer insulating layer 14, the second interlayer insulating layer 12, the wiring 20, and the sealing layer 30 in the semiconductor device 100, respectively. Modified examples of the semiconductor device 200 are also the same as the modified examples of the semiconductor device 100.

In the semiconductor device 200, the sealing layer 30 is present also at a portion other than the portion between the side face of the recess portion of the first interlayer insulating layer 14 and the first wiring 40 (namely, present on the first interlayer insulating layer 14); however, this sealing layer 30 located on the first interlayer insulating layer 14 needs not be present. For example, the sealing layer 30 located on the first interlayer insulating layer 14 may have been removed by a flattening treatment (for example, CMP) performed at the time of forming the first wiring 40.

In the semiconductor device according to the fourth invention, limitations are not imposed except that the sealing layer for a semiconductor should be present between the interlayer insulating layer and the first wiring (for example, between the side face of the recess portion provided in the interlayer insulating layer and the side face of the first wiring); for example, another layer such as a barrier layer may be present between the interlayer insulating layer (for example, the side face of the recess portion) and the sealing layer for a semiconductor, or between the sealing layer for a semiconductor and the first wiring (for example, the side face of the first wiring).

Further, limitations are not imposed except that the first wiring and the second wiring are electrically connected, and the first wiring and the second wiring may be directly connected or connected via one or more other layers having electric conductivity disposed therebetween.

A thickness of the sealing layer for a semiconductor in the connection portion between the first wiring and the second wiring of 5 nm or less means that the sealing layer for a semiconductor is not substantially present in the connection portion. As a result of the substantial absence of the sealing layer for a semiconductor in the connection portion, an increase in interconnection resistance between the first wiring and the second wiring is suppressed.

The thickness of the sealing layer for a semiconductor in the connection portion is measured using, for example, a field emission transmission electron microscope (FE-TEM).

The thickness of the sealing layer for a semiconductor in the connection portion is preferably 3 nm or less, more preferably 2 nm or less, particularly preferably 1 nm or less, and most preferably 0 nm (namely, it is most preferable that the sealing layer for a semiconductor is not present in the connection portion).

Nevertheless, in the semiconductor device according to the fourth invention, since the polymer layer (the sealing layer) having excellent sealing property with respect to the interlayer insulating layer is present between the interlayer insulating layer and the first wiring, diffusion of the material of the first wiring into the interlayer insulating layer is suppressed.

The semiconductor device according to the fourth invention is suitably produced by the method for manufacturing a semiconductor device according to the first invention, which includes the process of applying the sealing composition for a semiconductor and the removal process (and the washing process that may be performed, if necessary).

The semiconductor device according to the fourth invention is a device that cannot be produced by known methods for manufacturing semiconductor devices, and that can be produced, for the first time, by the method for manufacturing a semiconductor device according to the first invention.

<Semiconductor Device According to the Fifth Invention>

The semiconductor device according to the fifth invention includes an interlayer insulating layer, a first wiring that includes copper, and a sealing layer for a semiconductor that is present between the interlayer insulating layer and the first wiring, and that includes a polymer having a cationic functional group and a weight average molecular weight of from 2,000 to 1,000,000, the interlayer insulating layer, the first wiring, and the sealing layer for a semiconductor being provided on a semiconductor substrate, and the sealing layer for a semiconductor including at least one selected from the group consisting of an imide bond and an amide bond, and at least one selected from the group consisting of an aromatic ring structure, a manganese atom, and a silicon atom.

According to the semiconductor device according to the fifth invention, the plasma resistance of the sealing layer for a semiconductor is further improved.

In the semiconductor device according to the fifth invention, preferable ranges of the individual elements, such as the interlayer insulating layer and the polymer, are the same as the above-described preferable ranges of the respective elements described in the method for manufacturing a semiconductor device according to the first invention.

The semiconductor device according to the fifth invention can suitably be produced using the rinsing liquid according to the third invention.

Further, the semiconductor device according to the fifth invention is a device that cannot be produced by known methods for manufacturing semiconductor devices, and that can be produced, for the first time, by using the rinsing liquid according to the third invention.

Specifically, a method for manufacturing a semiconductor device using the rinsing liquid according to the third invention is preferably a manufacturing method (hereinafter also referred to as "method for manufacturing a semiconductor device according to the sixth invention") that includes:

a sealing composition application process of applying a sealing composition for a semiconductor onto an interlayer insulating layer of a semiconductor substrate provided with the interlayer insulating layer (which may have a recess portion), to form a sealing layer for a semiconductor on the interlayer insulating layer, the sealing composition for a semiconductor including a polymer having a cationic functional group and a weight average molecular weight of from 2,000 to 1,000,000, and each of the content of sodium and the content of potassium in the sealing composition for a semiconductor being 10 ppb by mass or less on an elemental basis;

a washing process of washing the formed sealing layer for a semiconductor with the rinsing liquid according to the third invention; and a wiring formation process of forming a first wiring that includes copper on at least a part of the washed sealing layer for a semiconductor.

In the method for manufacturing a semiconductor device according to the sixth invention, preferable ranges of the sealing composition application process, preferable ranges of the washing process, and preferable ranges of the wiring formation process are respectively the same as the preferable ranges of the sealing composition application process, the preferable ranges of the washing process, and the preferable ranges of the wiring formation process in the method for manufacturing a semiconductor device according to the first invention.

The method for manufacturing a semiconductor device according to the sixth invention may include the removal process described above, between the washing process and the wiring formation process.

Further, the method for manufacturing a semiconductor device according to the sixth invention may include the plasma process described above, after the washing process (in a case in which the removal process is included, preferably, after the removal process).

A mode of the method for manufacturing a semiconductor device according to the sixth invention that includes the removal process described above between the washing process and the wiring formation process is included in the scope of the method for manufacturing a semiconductor device according to the first invention.

Preferable modes of the method for manufacturing a semiconductor device according to the sixth invention are the same as the preferable modes of the method for manufacturing a semiconductor device according to the first invention, except that the preferable modes of the method for manufacturing a semiconductor device according to the sixth invention are not limited to modes in which the interlayer insulating film is provided with a recess portion (for example, a mode in which a wiring that includes copper is exposed on the bottom face of the recess portion of the interlayer insulating layer).

EXAMPLES

Hereinafter, the invention is specifically described with reference to examples. However, the scope of the invention is not limited to the examples.

Details of the respective components used in the Examples are as follows.

—Alkoxysilane Compound—

A product obtained by purifying bis(triethoxysilyl)ethane $((C_2H_5O)_3SiCH_2CH_2Si(OC_2H_5)_3$; manufactured by Gelest Inc.) by distillation.

Dimethyldiethoxysilane $((CH_3)_2Si(OC_2H_5)_2$; an electronics industrial grade product manufactured by Yamanaka Semiconductor Ltd.).

—Surfactant—

A product obtained by dissolving polyoxyethylene (20) stearyl ether $(C_{18}H_{37}O(CH_2CH_2O)_{20}H$; BRIJ 78 (tradename) manufactured by Sigma Chemical Company) in ethanol for electronics industry, and then subjecting the resultant solution to demetallization treatment using an ion exchange polymer until the metal content decreases to 10 ppb by mass or less.

—Disilyl Compound—

A product obtained by purifying hexamethyldisiloxane $(((CH_3)_3Si)_2O$; manufactured by Sigma-Aldrich Corporation) by distillation.

—Water—

Pure water that has been subjected to demetallization treatment, and that has a resistance value of 18 MΩ or higher.

—Organic solvent—

Ethanol ($C_2H_5OH$; electronics industrial grade product manufactured by Wako Pure Chemical Industries, Ltd.).

1-Propyl alcohol ($CH_3CH_2CH_2OH$; an electronics industrial grade product manufactured by Kanto Chemical Co., Inc.).

2-Butyl alcohol ($CH_3(C_2H_5)CHOH$; an electronics industrial grade product manufactured by Kanto Chemical Co., Inc.).

Example 1

<<Preparation of Silicon Wafer Provided with Interlayer Insulating Layer (Low-k Film)>>

<Preparation of Precursor Solution>

77.4 g of bis(triethoxysilyl)ethane and 70.9 g of ethanol were mixed and stirred at room temperature, and then 80 mL of 1 mol/L nitric acid were added thereto, and the resultant was stirred at 50° C. for 1 hour. Subsequently, a solution obtained by dissolving 20.9 g of polyoxyethylene (20) stearyl ether in 280 g of ethanol was dropwise added thereto and mixed. After mixing, the mixture was stirred at 30° C. for 4 hours. The resulting solution was concentrated to 105 g at 25° C., under a reduced pressure of 30 hPa. After concentration, a solution obtained by mixing 1-propyl alcohol and 2-butyl alcohol at a volume ratio of 2:1 was added thereto, to obtain a precursor solution in an amount of 1,800 g.

<Preparation of Composition for Forming Porous Silica>

3.4 g of dimethyldiethoxysilane and 1.8 g of hexamethyldisiloxane were added to 472 g of the precursor solution, and the mixture was stirred at 25° C. for 1 hour, to obtain a composition for forming porous silica. In the addition, the amount of dimethyldiethoxylsilane added and the amount of hexamethyldisiloxane added were 10 mol % and 5 mol %, respectively, with respect to bis(triethoxysilyl)ethane.

<Formation of Interlayer Insulating Layer>

1.0 mL of the composition for forming porous silica were dropped onto a surface of a silicon wafer, and the silicon wafer was rotated at 2000 rpm for 60 seconds, thereby coating the surface of the silicon wafer with the composition. Then, the silicon wafer was subjected to heating treatment, under a nitrogen atmosphere, at 150° C. for 1 minute and then at 350° C. for 10 minutes. Thereafter, the silicon wafer was thermally treated up to 350° C. in a chamber equipped with a 172 nm excimer lamp, and was irradiated with ultraviolet rays for 10 minutes at a pressure of 1 Pa and an output of 14mW/cm², to obtain an interlayer insulating layer (a porous silica film).

In this way, a silicon wafer provided with the interlayer insulating layer (hereinafter also referred to as "low-k film" or "low-k") was obtained.

The pore radius of the obtained interlayer insulating layer was 1.6 nm.

The relative dielectric constant k of the obtained interlayer insulating layer was 2.5.

Further, the elastic modulus of the obtained interlayer insulating layer was 8.8 GPa.

The pore radius was determined by calculation from the toluene desorption isotherm curve. Here, the toluene desorption isotherm measurement was conducted in a manner similar to that in the evaluation of sealing property described below, using an optical porosimeter (PS-1200, manufactured by SEMILAB CO., LTD.). Calculation of the pore radius was carried out using the Kelvin equation, following the procedure described in M. R. Baklanov, K. P. Mogilnikov, V. G. Polovinkin, and F. N. Dultsey, Journal of Vacuum Science and Technology B (2000) 18, 1385-1391.

The relative dielectric constant was measured by an ordinary method at a frequency of 1 MHz under an atmosphere of 25° C. and a relative humidity of 30%, using a mercury probe apparatus (SSM5130).

Further, the elastic modulus was measured according to an ordinary method, using a nanoindentater (TRIBO-SCOPE, by Hysitron, Inc.) at a penetration depth of 1/10 or less of the film thickness.

<<Preparation of Sealing Composition for Semiconductor>>

Highly-branched polyethyleneimine 1 (a polyethyleneimine that is highly branched) was synthesized, and then a sealing composition for a semiconductor that contained the obtained highly-branched polyethyleneimine 1 was prepared, in the manner described below. The specifics thereof are described below.

<Synthesis of Highly-Branched Polyethyleneimine 1>

(Synthesis of Modified Polyethyleneimine 1)

Modified polyethyleneimine 1 was synthesized according to the following reaction scheme 1, using polyethyleneimine as the starting material. It should be noted that the polymer structures in the following reaction scheme 1 and reaction scheme 2 are schematic structures, and the arrangements of tertiary nitrogen atoms and secondary nitrogen atoms, and the proportion of secondary nitrogen atoms that will be substituted by Boc-aminoethyl groups as described below may vary with the synthesis conditions.

- Reaction Scheme 1 -

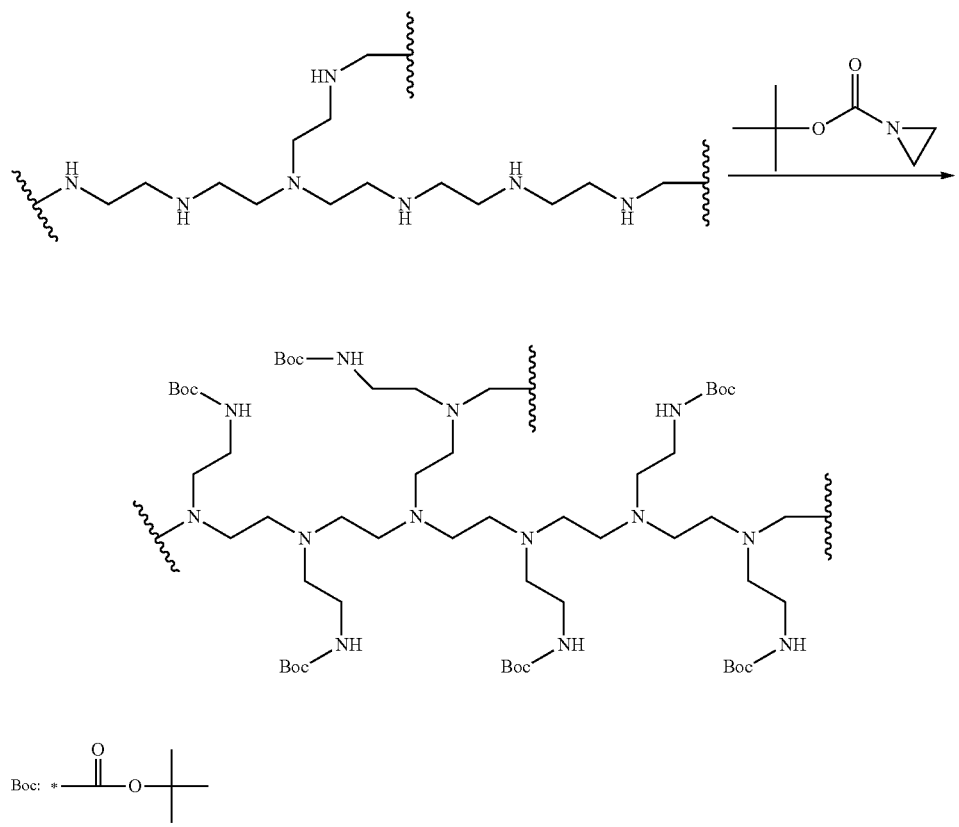

Detailed procedures in the above reaction scheme 1 were as follows.

61.06 g of polyethyleneimine (50% aqueous solution) manufactured by MP-Biomedicals Inc. were dissolved in 319 mL of isopropanol, and then 102 g (710 mmol) of N-t-butoxycarbonyl aziridine were added thereto (in the Examples, the "t-butoxycarbonyl group" is also referred to as "Boc"). The resultant was heated under reflux for 3 hours, to obtain modified polyethyleneimine 1 having a structure in which Boc-aminoethyl groups were introduced into the polyethyleneimine. It was confirmed that N-Boc aziridine as the raw material disappeared using thin layer chromatography (TLC), and a small amount of the product was sampled, and the structure thereof was confirmed using $^1$H-NMR. The introduction rate of Boc-aminoethyl groups with respect to the polyethyleneimine was calculated to be 95% based on the $^1$H-NMR.

—NMR Measurement Results of Modified Polyethyleneimine 1—

$^1$H-NMR (CD$_3$OD); δ 3.3-3.0 (br. s, 2), 2.8-2.5 (Br. s, 6.2), 1.45 (s, 9)

(Synthesis of Highly-Branched Polyethyleneimine 1)

Highly-branched polyethyleneimine 1 was synthesized according to the following reaction scheme 2, using the modified polyethyleneimine 1 as the starting material.

- Reaction Scheme 2 -

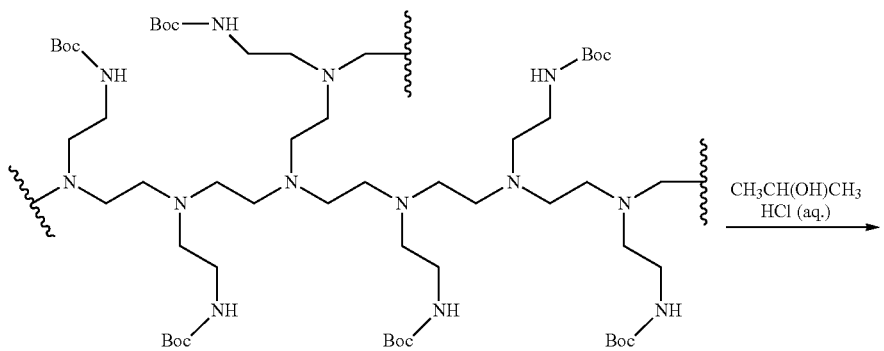

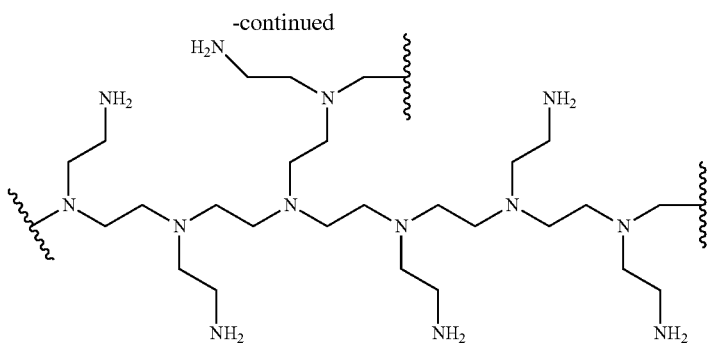
-continued

Detailed procedures in the above reaction scheme 2 were as follows.

124 mL of 12N hydrochloric acid were slowly added to the isopropanol solution of modified polyethyleneimine 1. The resulting solution was stirred under heating at 50° C. for 4 hours while care was taken about generation of gas. Together with the generation of gas, a gummy reaction product was produced in the reaction system. After the generation of gas completed, the reaction system was cooled. After cooling, solvent that separated from the gummy reaction product was removed, and the reaction product was washed three times with 184 mL of methanol. The reaction product after washing was dissolved in water, and chlorine ions were removed using an anion exchange polymer, to obtain an aqueous solution containing 58 g of highly-branched polyethyleneimine 1.

—NMR Measurement Results of Highly-Branched Polyethyleneimine 1—

$^1$H-NMR (D$_2$O); δ 2.8-2.4 (br. m)

$^{13}$C-NMR (D$_2$O); δ (integration ratio) 57.2 (1.0), 54.1 (0.38), 52.2 (2.26), 51.6 (0.27), 48.5 (0.07), 46.7 (0.37), 40.8 (0.19), 38.8 (1.06).

With regard to the highly-branched polyethyleneimine 1, the weight average molecular weight, the molecular weight distribution, the cationic functional group (primary nitrogen atom, secondary nitrogen atom, tertiary nitrogen atom, and quaternary nitrogen atom) equivalent weight, the amount of primary nitrogen atoms (mol %), the amount of secondary nitrogen atoms (mol %), the amount of tertiary nitrogen atoms (mol %), the amount of quaternary nitrogen atoms (mol %), and the degree of branching (%) were each measured.

As a result, the weight average molecular weight was 40,575, the molecular weight distribution was 17.47, the cationic functional group equivalent weight was 43, the amount of primary nitrogen atoms was 46 mol %, the amount of secondary nitrogen atoms was 11 mol %, the amount of tertiary nitrogen atoms was 43 mol %, the amount of quaternary nitrogen atoms was 0 mol %, and the degree of branching was 80%.

Here, the cationic functional group equivalent weight is a value of molecular weight per cationic functional group, and can be calculated based on the polymer structure.

Further, the amount of primary nitrogen atoms (mol %), the amount of secondary nitrogen atoms (mol %), the amount of tertiary nitrogen atoms (mol %), the amount of quaternary nitrogen atoms (mol %), and the degree of branching (%) were calculated based on the integrated value described below. Specifically, the polymer sample (highly-branched polyethyleneimine 1) was dissolved in heavy water, and the resulting solution was subjected to $^{13}$C-NMR measurement at 80° C. according to the single pulse inverse gated decoupling method, using an AVANCE 500 type nuclear magnetic resonance device manufactured by Bruker Corporation. Based on the measurement results, analysis was conducted to determine the types (primary, secondary, tertiary or quaternary) of the amines (nitrogen atoms) to which the individual carbon atoms bond to, and integrated values were obtained. The assignment is described in, for example, European Polymer Journal, 1973, vol. 9, page 559.

The weight average molecular weight and the molecular weight distribution were measured using an analyzer SHODEX GPC-101 and using a column ASAHIPAK GF-7M HQ, and calculated using polyethylene glycol as a reference standard. Further, an aqueous solution having an acetic acid concentration of 0.5 mol/L and a sodium nitrate concentration of 0.1 mol/L was used as the eluent. However, as is known from the Mark-Houwink-Sakurada equation, the calibration curve of GPC also changes with an increase in the degree of branching. Therefore, the weight average molecular weight and molecular weight distribution obtained are nothing more than polyethylene glycol-equivalent values.

Here, the amount of primary nitrogen atoms (mol %), the amount of secondary nitrogen atoms (mol %), the amount of tertiary nitrogen atoms (mol %), and the amount of quaternary nitrogen atoms (mol %) are the amounts represented by the following Formulas A to D, respectively. The degree of branching was obtained according to the following Formula E.

Amount of primary nitrogen atoms (mol %)=(molar number of primary nitrogen atoms/(molar number of primary nitrogen atoms+molar number of secondary nitrogen atoms+molar number of tertiary nitrogen atoms+molar number of quaternary nitrogen atoms))×100     Formula A Amount of secondary nitrogen atoms (mol %)=(molar number of secondary nitrogen atoms/(molar number of primary nitrogen atoms+molar number of secondary nitrogen atoms+molar number of tertiary nitrogen atoms+molar number of quaternary nitrogen atoms))×100     Formula B Amount of tertiary nitrogen atoms (mol %)=(molar number of tertiary nitrogen atoms/(molar number of primary nitrogen atoms+molar number of secondary nitrogen atoms+molar number of tertiary nitrogen atoms+molar number of quaternary nitrogen atoms))×100     Formula C Amount of quaternary nitrogen atoms (mol %)=(molar number of quaternary nitrogen atoms/(molar number of primary nitrogen atoms+molar number of secondary nitrogen atoms+molar number of tertiary nitrogen atoms+molar number of quaternary nitrogen atoms))×100     Formula D Degree of branching (%)=((amount of tertiary nitrogen atoms (mol %)+amount of quaternary nitrogen atoms (mol %))/(amount of secondary nitrogen atoms (mol %)+amount of tertiary nitrogen atoms (mol %)+amount of quaternary nitrogen atoms (mol %))×100    Formula E <Preparation of Sealing Composition for Semiconductor>

Water was added to the aqueous solution of highly-branched polyethyleneimine 1 (having a weight average molecular weight of 40,575 and a cationic functional group equivalent weight of 43) obtained as described above, such that the concentration of highly-branched polyethyleneimine 1 became 0.25% by mass, and the solution was mixed, to obtain a sealing composition for a semiconductor.

The content of sodium and the content of potassium in the resulting sealing composition for a semiconductor were measured using an inductively coupled plasma mass analyzer (ICP-MS). As a result, each of the content of sodium and the content of potassium was below the detection limit (<1 ppb by mass).

<<Preparation of Sample for Evaluation of Sealing Property>>

<Formation of Sealing Layer>

The silicon wafer provided with the low-k film was placed on a spin coater, and then 1 mL of the sealing composition for a semiconductor was dropped onto the low-k film and maintained for 23 seconds. Thereafter, this silicon wafer provided with the low-k film was rotated at 4,000 rpm for 1 second, then further rotated at 600 rpm for 30 seconds, and then further rotated at 2,000 rpm for 10 seconds, whereby the silicon wafer was dried.

In this way, a layer of the polymer contained in the sealing composition for a semiconductor (a sealing layer) was formed on the low-k film, to obtain a laminated body (hereinafter also referred to as "sample (Si/low-k/PEI)") having a structure in which a silicon wafer, a low-k-film, and a sealing layer are sequentially superposed one on another.

Hereinafter, the above procedures for forming the sealing layer are also simply referred to as procedures "C".

In the above procedures, the water employed was ultra-pure water (MILLI-Q WATER, manufactured by Millipore Corporation; resistivity of 18 MΩ·cm (at 25° C.) or less).

<Heat Treatment>

The sample (Si/low-k/PEI) was placed in an oven (SPX-1120 manufactured by APEX Co., Ltd.), and heat treatment at 350° C. was performed on the sealing layer (PEI)-formed side of this sample for 2 minutes in a nitrogen gas ($N_2$) atmosphere under a condition of a pressure of 10,000 Pa, as the removal process in the first invention. The temperature mentioned above is the surface temperature of the sample (Si/low-k/PEI) at a side at which the sealing layer (PEI) has been formed.

In this way, a sample for evaluation of sealing property was obtained.

<<Evaluation of Sealing Property>>

Using the sample (Si/low-k/PEI) after the heat treatment, evaluation of sealing property was carried out in the following manner.

The sealing property evaluation was carried out by measurement of toluene adsorption characteristics at the sealing layer (PEI) surface of the sample (Si/low-k/PEI). In this toluene adsorption characteristics measurement, a smaller toluene adsorption amount indicates a higher sealing property in terms of prevention of penetration of wiring materials (copper or the like) into the Low-k film.

The toluene adsorption measurement was carried out using an optical porosimeter (PS-1200) manufactured by SEMILAB CO., LTD.

The measurement was carried out following the procedure described in M. R. Baklanov, K. P. Mogilnikov, V. G. Polovinkin, and F. N. Dultsey, Journal of Vacuum Science and Technology B (2000) 18, 1385-1391.

Specifically, at a temperature range of from 23° C. to 26° C., the air in a sample chamber in which the sample (Si/low-k/PEI) was placed was exhausted to 5 mTorr, and then toluene gas was slowly and sufficiently introduced into the sample chamber. At respective pressure values, the refractive index of the low-k film was measured in situ, using an ellipsometer device. This procedure was repeated until the pressure inside the sample chamber reached the saturated vapor pressure of toluene. Similarly, while the atmosphere inside the sample chamber was gradually exhausted, the measurement of refractive index was carried out at respective pressure values. Through the above procedures, changes in the refractive index due to adsorption of toluene on the low-k film and desorption of toluene from the low-k film were determined. Further, using the Lorentz-Lorenz formula, the toluene gas adsorption desorption isotherm curve was determined from the relative pressure characteristics of the refractive index.

The toluene gas adsorption desorption isotherm curve is an isotherm curve illustrating the relationship between the toluene relative pressure ($P/P_0$, wherein P represents a partial pressure of toluene at room temperature, and $P_0$ represents a saturated vapor pressure of toluene at room temperature.) and the volume fraction of toluene adsorption amount (the percentage of the volume of adsorbed toluene at room temperature relative to the volume of the whole Low-k film; unit "%"). The volume fraction of toluene adsorption amount was determined based on the refractive index of the low-k film, using the Lorentz-Lorenz formula.

The volume fraction (%) of toluene adsorption amount at a toluene relative pressure ($P/P_0$) of 1.0 was determined based on the toluene gas adsorption desorption isotherm curve, and, based on the obtained value, the sealing property was evaluated. In this evaluation, a smaller volume fraction (%) of toluene adsorption amount indicates a higher sealing property.

The evaluation results are indicated in Table 1.

<<Evaluation of Thickness of Sealing Layer on Silicon (Si)>>

A sealing layer was formed on a silicon (Si) that is a similar material to the low-k film and the thickness of the sealing layer was measured, as an experiment for checking the thickness of the sealing layer on the low-k film after heat treatment.

Specifically, a sample for evaluation of the thickness of the sealing layer on the silicon was obtained in the same manner as that in the preparation of the sample for evaluation of sealing property described above, except that the silicon wafer provided with the low-k film was replaced by a silicon wafer.

The thickness (nm) of the sealing layer on the silicon (Si) in the obtained sample was measured according to an ordinary method, using an ellipsometer of an optical porosimeter (PS-1200) manufactured by SEMILAB CO., LTD.

The results of the measurement are indicated in Table 1 below.

<<Evaluation of Thickness of Sealing Layer on Copper (Cu)>>

A sealing layer was formed on a copper (Cu) substrate and the thickness of the sealing layer was measured, as an experiment for checking the thickness of the sealing layer on the copper-containing wiring after heat treatment.

A sample for evaluation of the thickness of the sealing layer on the copper (Cu) was obtained in the same manner as that in the preparation of the sample for evaluation of sealing property described above, except that the silicon wafer provided with the low-k film was replaced by a copper (Cu) substrate.

The thickness (nm) of the sealing layer on the copper (Cu) in the obtained sample was measured according to an ordinary method, using an ellipsometer of an optical porosimeter (PS-1200) manufactured by SEMILAB CO., LTD.

The results of the measurement are indicated in Table 1 below.

<<Evaluation of Thickness of Sealing Layer on Copper (Cu) Exposed on Bottom Face of Via>>

A sample provided with a copper wiring and having a configuration in which a low-k film having a 110 nm-wide via and a copper (Cu) wiring exposed on the bottom face of the via were provided was prepared. Further, a sealing layer was formed on a side of this copper-wiring-provided sample at which the low-k film, the via, or the like had been provided, and heat treatment was performed, in the same manner as that in the preparation of the sample for evaluation of sealing property described above.

After the heat treatment, Pt (platinum) sputtering was carried out with respect to a surface of the copper-wiring-provided sample at a side at which the sealing layer had been provided, and then carbon was deposited to form a protective layer. Then, the resultant was sliced (sliced in a direction such that a cross section of the copper wiring would be exposed), using an FIB processing device SMI-2050 (manufactured by Seiko Instruments Inc.), to prepare a sample for observation.

The sample for observation was observed using a field emission transmission electron microscope (FE-TEM) (JEM-2200FS, manufactured by JEOL Ltd.), and the thickness of the sealing layer on the copper wiring exposed on the bottom face of the via was measured. As a result, the thickness was found to be 4 nm.

Examples 2 and 3

Evaluations were conducted in the same manner as that in Example 1, except that the pressure in the heat treatment was changed as noted in Table 1 below.

The results of the evaluations are indicated in Table 1 below.

Example 4

Evaluations were conducted in the same manner as that in Example 1, except that the method of forming a sealing layer was changed as described below, and that the washing as described below was carried out between the formation of the sealing layer and the heat treatment.

The results of the evaluations are indicated in Table 1 below.

<Formation of Sealing Layer>

The procedures "C" as defined in Example 1 were carried out with respect to the substrate (the silicon wafer provided with the low-k film, the silicon wafer, or the copper substrate). Thereafter, the substrate was placed on a hotplate, and thermally treated at 125° C. for 60 seconds in the atmospheric air. In this way, a sealing layer was formed on the substrate.

The above procedures for forming a sealing layer are represented by "C→B" in Table 1 below.

<Washing>

While the substrate, on which a sealing layer had been formed as described above, was rotated at 600 rpm using a spin coater, ultrapure water as a rinsing liquid (having a liquid temperature of 63° C.) was dropped onto the sealing layer at a dropping rate of 0.1 mL/sec for 30 seconds, thereby washing the sealing layer. Thereafter, the substrate was rotated at 4,000 rpm for 60 seconds, whereby the substrate was dried.

The substrate after the washing and drying was then subjected to heat treatment in the same manner as that in Example 1.

Example 5

Evaluations were conducted in the same manner as that in Example 4, except that the liquid temperature of ultrapure water used as the rinsing liquid was changed to 22° C.

The results of the evaluations are indicated in Table 1 below.

Example 6

Evaluations were conducted in the same manner as that in Example 5, except that the pressure and time of the heat treatment were changed as noted in Table 1 below.

The results of the evaluations are indicated in Table 1 below.

Example 7

Evaluations were conducted in the same manner as that in Example 4, except that the procedures of washing carried out between the formation of the sealing layer and the heat treatment was replaced by the following procedures.

The results of the evaluations are indicated in Table 1 below.

<Washing>

While the substrate on which the sealing layer was formed was rotated at 600 rpm using a spin coater, a citric acid aqueous solution (at pH 2 having a liquid temperature of 22° C.) as a rinsing liquid was dropped at a dropping rate of 0.1 mL/sec for 30 seconds, thereby washing the sealing layer. Thereafter, ultrapure water (having a liquid temperature of 22° C.) was dropped at a dropping rate of 0.1 mL/sec for 30 seconds. Then, the substrate was rotated at 4,000 rpm for 60 seconds, whereby the substrate was dried.

Example 8

Evaluations were conducted in the same manner as that in Example 7, except that the citric acid aqueous solution (pH 2 having a liquid temperature of 22° C.) used in Example 7 was replaced by a citric acid aqueous solution (pH 4 having a liquid temperature of 22° C.).

The results of the evaluations are indicated in Table 1 below.

Example 9

Evaluations were conducted in the same manner as that in Example 7, except that the citric acid aqueous solution (pH 2 having a liquid temperature of 22° C.) used in Example 7 was replaced by a citric acid aqueous solution (pH 4 having a liquid temperature of 63° C.).

The results of the evaluations are indicated in Table 1 below.

Comparative Example 1

Evaluations were conducted in the same manner as that in Example 1, except that the heat treatment conditions were replaced as noted in Table 2 below.

The results of the evaluations are indicated in Table 2 below.

In Comparative Example 1, the thickness of the sealing layer on the copper wiring exposed on the bottom face of the via was 25 nm.

Comparative Example 2

Evaluations were conducted in the same manner as that in Example 4, except that the heat treatment after washing was not carried out.

The results of the evaluations are indicated in Table 2 below.

Comparative Example 3

Evaluations were conducted in the same manner as that in Example 5, except that the heat treatment after washing was not carried out.

The results of the evaluations are indicated in Table 2 below.

Comparative Example 4

Evaluations were conducted in the same manner as that in Example 1, except that the heat treatment conditions were changed as noted in Table 2 below.

The results of the evaluations are indicated in Table 2 below.

TABLE 1

| | | | Example 1 | Example 2 | Example 3 | Example 4 | Example 5 | Example 6 | Example 7 | Example 8 | Example 9 |
|---|---|---|---|---|---|---|---|---|---|---|---|
| Formation of Sealing Layer | Procedures | | C | C | C | C → B | C → B | C → B | C → B | C → B | C → B |
| Washing | Rinsing Liquid, Liquid Temperature (° C.) | | (no washing) | (no washing) | (no washing) | $H_2O$, 63° C. | $H_2O$, 22° C. | $H_2O$, 22° C. | Citric acid aq. (pH 2), 22° C. | Citric acid aq. (pH 4), 22° C. | Citric acid aq. (pH 4), 63° C. |
| Heat Treatment | Temperature (° C.) | | 350 | 350 | 350 | 350 | 350 | 350 | 350 | 350 | 350 |
| | Gas | | $N_2$ | $N_2$ | $N_2$ | $N_2$ | $N_2$ | $N_2$ | $N_2$ | $N_2$ | $N_2$ |
| | Pressure (Pa) | | 10,000 | 50,000 | 90,000 | 10,000 | 10,000 | 17 | 10,000 | 10,000 | 10,000 |
| | Time (min) | | 2 | 2 | 2 | 2 | 2 | 10 | 2 | 2 | 2 |
| Evaluation | Sealing Property | Toluene Adsorption Amount (%) | 6.4 | 5.6 | — | 4.2 | 4.0 | 0.8 | 2.7 | 5.7 | 2.8 |
| | Thickness of Sealing Layer [nm] | on Si | 4.3 | 4.2 | 4.7 | 1.8 | 2.5 | 3.9 | 1.7 | 2.1 | 1.5 |
| | | on Cu | 1.0 | 1.2 | 1.1 | 0.8 | 1.6 | 2.2 | 0.4 | 0.9 | 0.5 |

TABLE 2

| | | | Comparative Example 1 | Comparative Example 2 | Comparative Example 3 | Comparative Example 4 |
|---|---|---|---|---|---|---|
| Formation of Sealing Layer | Procedures | | C | C → B | C → B | C → B |
| Washing | Rinsing Liquid, Liquid Temperature (° C.) | | (no washing) | $H_2O$ 63° C. | $H_2O$ 22° C. | $H_2O$ 22° C. |
| Heat Treatment | Temperature (° C.) | | 125 | — | — | 125 |
| | Gas | | Air | (no heat treatment) | (no heat treatment) | $N_2$ |
| | Pressure (Pa) | | Atmospheric pressure | | | 17 |
| | Time (min) | | 1 | | | 10 |
| Evaluation | Sealing Property | Toluene Adsorption Amount (%) | — | — | 6.0 | 1.0 |
| | Thickness of Sealing Layer [nm] | on Si | 5.3 | 2.6 | 4.0 | 4.7 |
| | | on Cu | 9.5 | 7.4 | 8.8 | 7.2 |

As shown in Table 1 and Table 2, in Examples 1 to 9, the thickness of the sealing layer on Cu could be reduced although certain degrees of the sealing property with respect to the low-k film and the thickness of the sealing layer on Si were maintained.

Example 10

<<Preparation of Sample for Evaluation of Sealing Property after Plasma Treatment>>
A sample for evaluation of sealing property after plasma treatment was prepared in the same manner as that in the preparation of the sample for evaluation of sealing property in Example 5, except that plasma treatment under the following conditions was further carried out on the sealing layer (PEI) side of the sample (Si/low-k/PEI) after heat treatment (after heat treatment that serves as the removal process).
—Plasma Treatment Conditions—
Gas that was used: hydrogen gas
Electrode that was used: parallel plate-shaped electrodes (φ10 cm)
Ultimate vacuum: less than $2 \times 10^{-5}$ Torr
Hydrogen gas flow: 5 minutes
Discharge power: 100 W
Discharge frequency: 13.56 MHz
Pressure at the time of discharge: 150 mTorr
Temperature of electrodes: room temperature
Temperature of sample surface: room temperature
Flow rate of hydrogen gas: 50 sccm
Side where the sample was placed: on the anode electrode to which the ground potential (0 V) was applied
Treatment time (discharge time): 20 seconds
<<Evaluation of Sealing Property after Plasma Treatment>>
Evaluation of sealing property was performed on the sample for evaluation of sealing property after plasma treatment, in the same manner as that in Example 5.
The results of the evaluation are indicated in Table 3 below.
<<Evaluation of Thickness (after Heat Treatment) of Sealing Layer on Silicon (Si)>>
A sample for evaluation of the thickness (after heat treatment) of the sealing layer on silicon was obtained in the same manner as that in the preparation of the sample for evaluation of sealing property after plasma treatment, except that the silicon wafer provided with the low-k film was replaced by a silicon wafer, and that the plasma treatment was not carried out.
The thickness (after heat treatment) of the sealing layer on the silicon (Si) in the obtained sample was measured in the same manner as that in Example 5.
The results of the measurement are indicated in Table 3 below.
<<Evaluation of Thickness (after Heat Treatment) of Sealing Layer on Copper (Cu)>>
A sample for evaluation of the thickness (after heat treatment) of the sealing layer on copper (Cu) was obtained in the same manner as that in the preparation of the sample for evaluation of sealing property after plasma treatment, except that the silicon wafer provided with the low-k film was replaced by a copper (Cu) substrate, and that the plasma treatment was not carried out.
The thickness (after heat treatment) of the sealing layer on the copper (Cu) in the obtained sample was measured in the same manner as that in Example 5.
The results of the measurement are indicated in Table 3 below.

Example 11

Evaluations were conducted in the same manner as that in Example 10, except that the treatment time (discharge time) in the plasma treatment was changed to 30 seconds.
The results of the evaluations are indicated in Table 3 below.

Example 12

Evaluations were conducted in the same manner as that in Example 10, except that the procedures of washing carried out between the formation of the sealing layer and the heat treatment was replaced by the following procedures.
The results of the evaluations are indicated in Table 3 below.
<Washing>
While the substrate on which the sealing layer was formed was rotated at 600 rpm using a spin coater, an pyromellitic acid aqueous solution (at pH 2 having a liquid temperature of 22° C.) as a rinsing liquid was dropped at a dropping rate of 0.1 mL/sec for 30 seconds, thereby washing the sealing layer. Thereafter, ultrapure water (having a liquid temperature of 22° C.) was dropped at a dropping rate of 0.1 mL/sec for 30 seconds. Then, the substrate was rotated at 4,000 rpm for 60 seconds, whereby the substrate was dried.

Example 13

Evaluations were conducted in the same manner as that in Example 12, except that the treatment time (discharge time) in the plasma treatment was changed to 30 seconds.
The results of the evaluations are indicated in Table 3 below.

TABLE 3

|  |  | Example 10 | Example 11 | Example 12 | Example 13 |
|---|---|---|---|---|---|
| Formation of Sealing Layer | Procedures | C → B | C → B | C → B | C → B |
| Washing | Rinsing Liquid, Liquid Temperature (° C.) | $H_2O$ 22° C. | $H_2O$ 22° C. | Pyromellitic acid aq. (pH 2), 22° C. | Pyromellitic acid aq. (pH 2), 22° C. |
| Heat Treatment | Temperature (° C.) | 350 | 350 | 350 | 350 |
|  | Gas | $N_2$ | $N_2$ | $N_2$ | $N_2$ |
|  | Pressure (Pa) | 10,000 | 10,000 | 10,000 | 10,000 |
|  | Time (min) | 2 | 2 | 2 | 2 |

TABLE 3-continued

|  |  |  | Example 10 | Example 11 | Example 12 | Example 13 |
|---|---|---|---|---|---|---|
| Evaluation after Heat Treatment | Thickness of Sealing Layer [nm] | on Si | 3.0 | 3.0 | 3.0 | 3.0 |
|  |  | on Cu | 1.8 | 1.8 | 1.7 | 1.7 |
| Plasma Treatment |  | Gas | $H_2$ | $H_2$ | $H_2$ | $H_2$ |
|  |  | Pressure (mtorr) | 150 | 150 | 150 | 150 |
|  |  | Time (sec) | 20 | 30 | 20 | 30 |
| Evaluation after Plasma Treatment | Sealing Property | Toluene Adsorption Amount (%) | 26.8 | 24.4 | 6.0 | 7.0 |

As shown in Table 3, it was confirmed that the sealing property after plasma treatment was high (namely, the plasma resistance of the sealing layer was high) in Examples 12 and 13, in which pyromellitic acid was used as the rinsing liquid, as compared with Examples 10 and 11, in which water was used as the rinsing liquid.

Examples 14 to 36

The same procedures as those in Example 10 were performed, except that the additional compound noted in the row titled "additional compound" in Tables 4 to 6 below was added to the rinsing liquid such that the content of the additional compound (its content with respect to the total amount of the rinsing liquid) became the content noted in the row titled "content of additional compound" in Tables 4 to 6 below, and that the procedures for forming the sealing layer were replaced by the procedures noted in the row titled "formation of sealing layer" in Tables 4 to 6 below, and that the gas, $H_2$, employed in the plasma treatment was replaced by He.

In the row titled "formation of sealing layer" in Tables 4 to 6, "(C→B)×3" represents procedures in which the procedures represented by "C→B" are repeated three times.

All of the additional compounds noted in the row titled "additional compound" are compounds each of which has, in one molecule thereof, at least one of a moiety A that blocks an active species or a moiety B that forms a bond with the polymer when heated.

Here, the changes in thickness of the sealing layer on silicon are almost the same regardless of whether the gas used in the plasma treatment is $H_2$ or He, provided that the plasma irradiation time is constant.

<<FT-IR>>

FT-IR (Fourier transform infrared spectroscopy) analysis was performed with respect to the sealing layer-formed side of the sample for evaluation of the thickness (after heat treatment) of the sealing layer on silicon, using the following analysis device under the following measurement conditions.

In the FT-IR spectrum obtained, the presence or absence of peaks that appear at about 1778 $cm^{-1}$, 1738 $cm^{-1}$, and 1366 $cm^{-1}$, and that originate from C=O stretching vibration or C—N stretching vibration of an imido group was checked, whereby the presence or absence of an imide bond in the sample was checked.

The results are indicated in Tables 4 to 6 below.
—FT-IR Analysis Device—
Infrared absorption analyzer (DIGILAB EXCALIBUR (manufactured by DIGILAB, Inc.))
—Measurement Conditions—
IR source: air-cooled ceramic
beamsplitter: wide-range KBr
detector: Peltier-cooled DTGS
measurement wavenumber range: 7500 $cm^{-1}$ to 400 $cm^{-1}$
resolution: 4 $cm^{-1}$
cumulative number: 256
background: bare Si wafer is used
measurement atmosphere: $N_2$ (10 L/min)
angle of incidence of IR (infrared radiation): 72° (=Brewster's angle of Si)

<<Plasma Resistance>>

The thickness of the sealing layer on the silicon (Si) was measured in the same manner as that in Example 10, before plasma treatment (namely, after heat treatment), and after plasma treatment.

Based on the measurement results, a change in thickness (residual film ratio) of the sealing layer due to the plasma treatment was determined according to the following equation (a).

The change in thickness of the sealing layer due to the plasma treatment=the thickness of the sealing layer after the plasma treatment/the thickness of the sealing layer before the plasma treatment    Equation (a):

The results of the measurement of the change in thickness of the sealing layer due to the plasma treatment are indicated in Tables 4 to 6.

In Tables 4 to 6, the measurement results are indicated as relative values, assuming that the measurement result in Example 16 is 1.00.

TABLE 4

|  |  |  | Example 14 | Example 15 | Example 16 | Example 17 | Example 18 | Example 19 | Example 20 | Example 21 | Example 22 |
|---|---|---|---|---|---|---|---|---|---|---|---|
| Formation of Sealing Layer |  | Procedures | (C → B) × 3 | C → B | (C → B) × 3 | C → B | (C → B) × 3 | C → B | (C → B) × 3 | C → B | (C → B) × 3 |
| Washing | Rinsing Liquid | Additional Compound | OPDA | OPDA | BPDA | BPDA | BTDA | BTDA | 2367NDA | 2367NDA | 1458NDA |
|  |  | Content of Additional Compound (mmol/L) | 0.39 | 0.39 | 0.39 | 0.39 | 0.39 | 0.39 | 0.39 | 0.39 | 0.22 |
|  |  | pH | 4.0 | 4.0 | 4.5 | 4.5 | 4.0 | 4.0 | 4.5 | 4.5 | 4.5 |

TABLE 4-continued

|  |  |  | Example 14 | Example 15 | Example 16 | Example 17 | Example 18 | Example 19 | Example 20 | Example 21 | Example 22 |
|---|---|---|---|---|---|---|---|---|---|---|---|
| Evaluation after Heat Treatment | Thickness of Sealing Layer [nm] | on Si | 17.0 | 4.1 | 21.2 | 4.5 | 17.1 | 3.9 | 15.2 | 4.4 | 6.9 |
|  |  | on Cu | N.D. | 0.5 | N.D. | 0.1 | N.D. | 0.5 | N.D. | 0.0 | N.D. |
|  | FT-IR | Presence or Absence of Imide Bond | N.D. | Present | N.D. | Present | N.D. | Present | N.D. | Present | N.D. |
| Evaluation after Plasma Treatment | Sealing Property | Toluene Adsorption Amount (%) | N.D. | 3.1 | N.D. | 2.2 | N.D. | 4.5 | N.D. | 5.1 | N.D. |
|  | Plasma Resistance | Change in Thickness of Sealing Layer due to Plasma Treatment (relative value) | 0.95 | 0.66 | 1.00 | 0.64 | 0.99 | 0.74 | 0.97 | N.D. | 0.93 |

TABLE 5

|  |  |  | Example 23 | Example 24 | Example 25 | Example 26 | Example 27 | Example 28 | Example 29 |
|---|---|---|---|---|---|---|---|---|---|
| Formation of Sealing Layer |  | Procedures | (C → B) × 3 | (C → B) × 3 | (C → B) × 3 | (C → B) × 3 | (C → B) × 3 | (C → B) × 3 | (C → B) × 3 |
| Washing | Rinsing Liquid | Additional Compound | MeA | PMDA | TMA | m-PhDA | PAA | BcDA | MBTCA |
|  |  | Content of Additional Compound (mmol/L) | 0.39 | 0.39 | 0.39 | 0.39 | 0.39 | 0.39 | 0.39 |
|  |  | pH | 4.0 | 4.0 | 4.0 | 5.0 | 5.5 | 4.5 | 4.5 |
| Evaluation after Heat Treatment | Thickness of Sealing Layer [nm] | on Si | 13.5 | 11.7 | 8.4 | 7.5 | 9.3 | 16.0 | 10.0 |
|  |  | on Cu | N.D. | N.D. | N.D. | N.D. | N.D. | N.D. | N.D. |
|  | FT-IR | Presence or Absence of Imide Bond | N.D. | Present | Present | Present | Present | N.D. | N.D. |
| Evaluation after Plasma Treatment | Sealing Property | Toluene Adsorption Amount (%) | N.D. | N.D. | N.D. | N.D. | N.D. | N.D. | N.D. |
|  | Plasma Resistance | Change in Thickness of Sealing Layer due to Plasma Treatment (relative value) | 0.95 | 0.93 | 0.96 | 0.89 | 0.83 | 0.92 | 0.89 |

TABLE 6

|  |  |  | Example 30 | Example 31 | Example 32 | Example 33 | Example 34 | Example 35 | Example 36 |
|---|---|---|---|---|---|---|---|---|---|
| Formation of Sealing Layer |  | Procedures | (C → B) × 3 | (C → B) × 3 | (C → B) × 3 | (C → B) × 3 | (C → B) × 3 | (C → B) × 3 | (C → B) × 3 |
| Washing | Rinsing Liquid | Additional Compound | EDTA | Citric acid | Oxalic acid | Formic acid | o-PhALD | MnDA | BTA |
|  |  | Content of Additional Compound (mmol/L) | 0.39 | 0.39 | 0.39 | 0.39 | 0.39 | 0.39 | 0.39 |
|  |  | pH | 5.0 | 4.5 | 4.0 | 4.5 | 7.0 | 6.0 | 6.0 |
| Evaluation after Heat Treatment | Thickness of Sealing Layer [nm] | on Si | 11.0 | 7.2 | 5.6 | 4.9 | 3.3 | 3.2 | 2.6 |
|  |  | on Cu | N.D. | N.D. | N.D. | N.D. | N.D. | N.D. | N.D. |
|  | FT-IR | Presence or Absence of Imide Bond | N.D. | Present | N.D. | N.D. | N.D. | N.D. | N.D. |
| Evaluation after Plasma Treatment | Sealing Property | Toluene Adsorption Amount (%) | N.D. | N.D. | N.D. | N.D. | N.D. | N.D. | N.D. |
|  | Plasma Resistance | Change in Thickness of Sealing Layer due to Plasma Treatment (relative value) | 0.79 | 0.89 | 0.80 | 0.51 | 0.79 | 0.66 | 0.62 |

The additional compounds noted in Tables 4 to 6 are as follows.
—Additional Compound—
OPDA: 3,3',4,4'-diphenyl ether tetracarboxylic acid
BPDA: 3,3',4,4'-biphenyltetracarboxylic acid
BTDA: 3,3',4,4'-benzophenonetetracarboxylic acid
2367NDA: naphthalene-2,3,6,7-tetracarboxylic acid
1458NDA: naphthalene-1,4,5,8-tetracarboxylic acid
MeA: benzene hexacarboxylic acid
PMDA: pyromellitic acid
TMA: trimellitic acid
m-PhDA: meta-phenylene diacetic acid
PAA: polyacrylic acid (having a weight average molecular weight of 25,000)
BcDA: bicyclo[2.2.2]oct-7-ene-2,3,5,6-tetracarboxylic acid
MBTCA: meso-butane-1,2,3,4-tetracarboxylic acid
EDTA: ethylenediamine tetraacetic acid
o-PhALD: ortho-phthalaldehyde
MnDA: manganese(II) diacetate
BTA: benzotriazole In Tables 4 to 6, "N. D." (No Data) refers to absence of measurement results.

As shown in Tables 4 to 6, it was confirmed that a change in thickness of the sealing layer due to plasma treatment can be suppressed (namely, the plasma resistance of the sealing layer can be improved) by adding a compound having, in one molecule thereof, at least one of a moiety A that blocks an active species or a moiety B that forms a bond with the polymer when heated (the specific compound) into the rinsing liquid.

In particular, it was confirmed that the effect in terms of improving the plasma resistance is remarkably high in a case in which the specific compound is a compound that has, in one molecule thereof, two or more carboxyl groups as the moiety B, and that has, in one molecule thereof, at least one of a structure in which each of two neighboring carbon atoms bonds to a carboxyl group or a structure in which each of two non-central carbon atoms from among three consecutive carbon atoms bonds to a carboxyl group (OPDA, BPDA, BTDA, 2367NDA, 1458NDA, MeA, PMDA, TMA, BcDA, MBTCA, or citric acid), or in a case in which the specific compound is a compound that has the moiety A and the moiety B, and in which the moiety A is at least one selected from the group consisting of an aromatic ring structure, an alicyclic structure, a manganese atom, and a silicon atom, and in which the moiety B is a carboxyl group (OPDA, BPDA, BTDA, 2367NDA, 1458NDA, MeA, PMDA, TMA, m-PhDA, or BcDA).

Further, it was confirmed that the thickness of the sealing layer on Cu can be reduced although certain degrees of the sealing property with respect to the low-k film and the thickness of the sealing layer on Si can be maintained, also in a case in which a rinsing liquid that includes the specific compound is used.

Examples 37 and 38

Evaluations were performed in the same manner as that in Examples 16 and 24, except that the sample was heated before the plasma treatment was heated, and that the temperature of the surface of the sample at the time of plasma treatment was thus changed to 250° C. The results of the evaluations are indicated in the following Table 7.

TABLE 7

| Formation of Sealing Layer | | Procedures | Example 37 (C → B) × 3 | Example 38 (C → B) × 3 |
|---|---|---|---|---|
| Washing | Rinsing Liquid | Additional Compound | BPDA | PMDA |
| | | Content of Additional Compound (mmol/L) | 0.39 | 0.39 |
| | | pH | 4.5 | 4.0 |
| Evaluation after Heat Treatment | Thickness of Sealing Layer [nm] | on Si | 19.9 | 13.2 |
| | | on Cu | N. D. | N. D. |
| | FT-IR | Presence or Absence of Imide Bond | N. D. | N. D. |
| Evaluation after Plasma Treatment | Sealing Property | Toluene Adsorption Amount (%) | N. D. | N. D. |
| | Plasma Resistance | Change in Thickness of Sealing Layer due to Plasma Treatment (relative value) | 0.97 | 0.96 |

As shown in Table 7, it was confirmed that a change in thickness of the sealing layer due to plasma treatment can be suppressed (namely, the plasma resistance of the sealing layer can be improved) also in a case in which the temperature of the surface of the sample at the time of plasma treatment is set at 250° C., similar to Examples 16 and 24 (, in which the temperature of the surface of the sample at the time of plasma treatment was room temperature).

The disclosures of Japanese Patent Application No. 2012-158979 and Japanese Patent Application No. 2013-039944 are incorporated by reference herein in their entirety.

All publications, patent applications, and technical standards mentioned in this specification are herein incorporated by reference to the same extent as if such individual publication, patent application, or technical standard was specifically and individually indicated to be incorporated by reference.

The invention claimed is:

1. A method for manufacturing a semiconductor device, the method comprising:
a sealing composition application process of applying a sealing composition for a semiconductor to at least a bottom face and a side face of a recess portion of a semiconductor substrate, to form a sealing layer for a semiconductor on at least the bottom face and the side face of the recess portion, the sealing composition for a semiconductor including a polymer having a cationic functional group and a weight average molecular weight of from 2,000 to 1,000,000, each of the content of sodium and the content of potassium in the sealing composition for a semiconductor being 10 ppb by mass or less on an elemental basis, and the semiconductor substrate being provided with an interlayer insulating layer having the recess portion and a copper-containing wiring of which at least a part of a surface thereof is exposed on at least a part of the bottom face of the recess portion; and
a removal process of subjecting a surface of the semiconductor substrate at a side at which the sealing layer for a semiconductor has been formed to heat treatment under a temperature condition of from 200° C. to 425° C., to remove at least a part of the sealing layer for a semiconductor that has been formed on an exposed face of the wiring, but leave at least a part of the sealing layer for a semiconductor that covers a side face or recess portion.

2. The method for manufacturing a semiconductor device according to claim 1, wherein the polymer has a cationic functional group equivalent weight of from 27 to 430.

3. The method for manufacturing a semiconductor device according to claim 1, wherein the polymer is polyethyleneimine or a polyethyleneimine derivative.

4. The method for manufacturing a semiconductor device according to claim 1, the method comprising a washing process of washing at least the side face and the bottom face of the recess portion with a rinsing liquid having a temperature of from 15° C. to 100° C., after the sealing composition application process but before the removal process.

5. The method for manufacturing a semiconductor device according to claim 4, wherein the temperature of the rinsing liquid is from 30° C. to 100° C.

6. The method for manufacturing a semiconductor device according to claim 1, the method comprising a washing process of washing at least the side face and the bottom face of the recess portion with a rinsing liquid having a pH at 25° C. of 6 or lower, after the sealing composition application process but before the removal process.

7. The method for manufacturing a semiconductor device according to claim 6, wherein the rinsing liquid includes a compound having, in one molecule thereof, at least one of a moiety A that blocks an active species or a moiety B that forms a bond with the polymer when heated.

* * * * *